(12) United States Patent
Colin et al.

(10) Patent No.: US 8,269,567 B2
(45) Date of Patent: Sep. 18, 2012

(54) FLICKER NOISE CANCELLATION IN OSCILLATORS

(75) Inventors: Sylvain M. Colin, San Diego, CA (US); Jun Young Park, San Diego, CA (US); Marzio Pedrali Noy, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 89 days.

(21) Appl. No.: 12/775,339

(22) Filed: May 6, 2010

(65) Prior Publication Data

US 2010/0283552 A1 Nov. 11, 2010

Related U.S. Application Data

(60) Provisional application No. 61/176,358, filed on May 7, 2009.

(51) Int. Cl.
*H03K 3/02* (2006.01)
(52) U.S. Cl. .................. 331/143; 331/111
(58) Field of Classification Search .......... 331/57, 331/111, 143, 175
See application file for complete search history.

(56) References Cited

U.S. PATENT DOCUMENTS

| 4,001,723 | A | * | 1/1977 | Sheng et al. | 331/111 |
| 4,250,464 | A | * | 2/1981 | Schade, Jr. | 331/65 |
| 4,988,958 | A | * | 1/1991 | Tsuruoka et al. | 331/111 |
| 6,172,573 | B1 | * | 1/2001 | Lim | 331/111 |
| 6,353,368 | B1 | * | 3/2002 | Iravani | 331/57 |
| 7,005,933 | B1 | * | 2/2006 | Shutt | 331/143 |
| 8,054,141 | B2 | * | 11/2011 | Saw | 331/111 |
| 2007/0236372 | A1 | | 10/2007 | Lin et al. | |

OTHER PUBLICATIONS

Boas A., et al., "A temperature compensated digitally trimmable on-chip IC oscillator with low voltage inhibit capability," Proceedings of the 2004 International Symposium, 2004,1-501.
International Search Report and Written Opinion—PCT/US2010/034131, International Search Authority—European Patent Office—Aug. 16, 2010.
Zou, et al., "A 1-V 450-nW Fully Integrated Programmable Biomedical Sensor Interface Chip," IEEE Journal of Solid-State Circuits, 2009, vol. 44 (4), 1067-1077.
1-Hajimiri et al., "Jitter and Phase Noise in Ring Oscillators," IEEE Journal of Solid-State Circuits, vol. 34, No. 6, Jun. 1999.
2-Flynn et al., "A 1.2-um CMOS Current-Controlled Oscillator," IEEE Journal of Solid-state Circuits, vol. 25, pp. 982-987, Jul. 1992.
3-Abidi et al., "Noise in Relaxation Oscillators," IEEE Journal of Solid State Circuits, pp. 794-802, 1983.

(Continued)

*Primary Examiner* — Joseph Chang
(74) *Attorney, Agent, or Firm* — Eric Ho

(57) ABSTRACT

An oscillator is disclosed. The oscillator includes a first capacitor. The oscillator also includes a second capacitor. The oscillator further includes a first current source. The oscillator also includes a second current source. The oscillator further includes a comparator that has a first input and a second input. The oscillator also includes a reference node. The oscillator further includes a controller that is configured to selectively couple the first current source to the first capacitor and the second current source to the reference node during a first time period.

54 Claims, 16 Drawing Sheets

OTHER PUBLICATIONS

4-Geraedts et al., "A 90 µW 12MHz Relaxation Oscillator With A—162dB FOM," Solid-State Circuits Conference, ISSCC 2008, Digest of Technical Papers, IEEE International, pp. 348, 2008.

5-Klumperink et al., "Reducing MOSFET 1/f Noise and Power Consumption by Switched Biasing," IEEE Journal of Solid-State Circuits, vol. 35, No. 7, Jul. 2000.

6-Tokunaga, et al., "An On-Chip CMOS Relaxation Oscillator With Power Averaging Feedback Using a Reference Proportional to Supply Voltage", ISSCC 2009, Session 23, PLLs and Clocks, 23.8, 2009.

7-Chloe et al., "A Precision Relaxation Oscillator With a Self-Clocked Offset-Cancellation Scheme for Implantable Biomedical SoCs", ISSCC 2009, Session 23, PLLs and Clocks, 23.7, 2009.

* cited by examiner

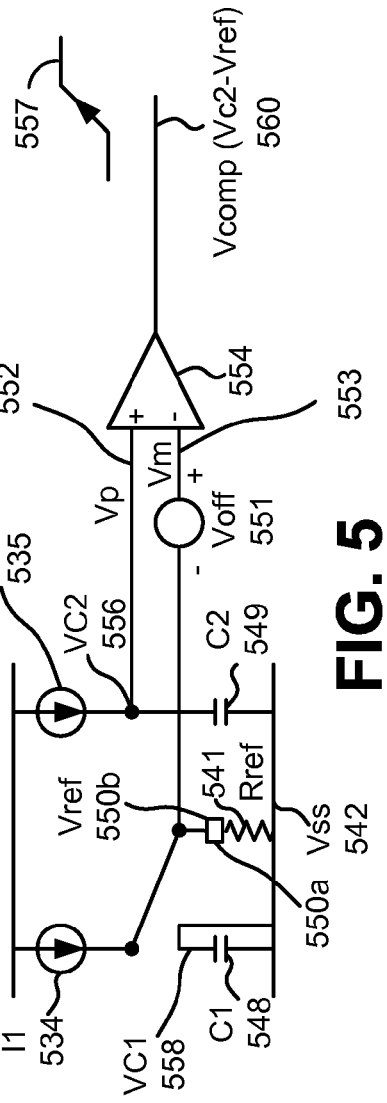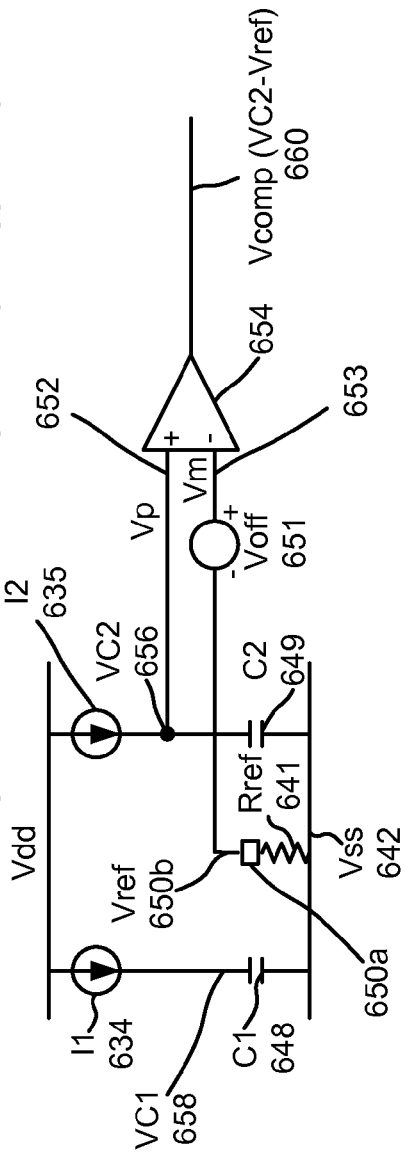

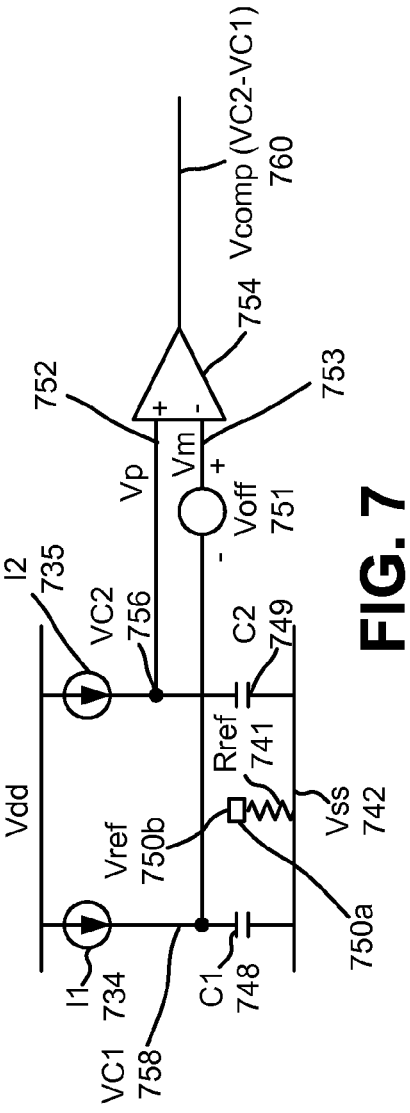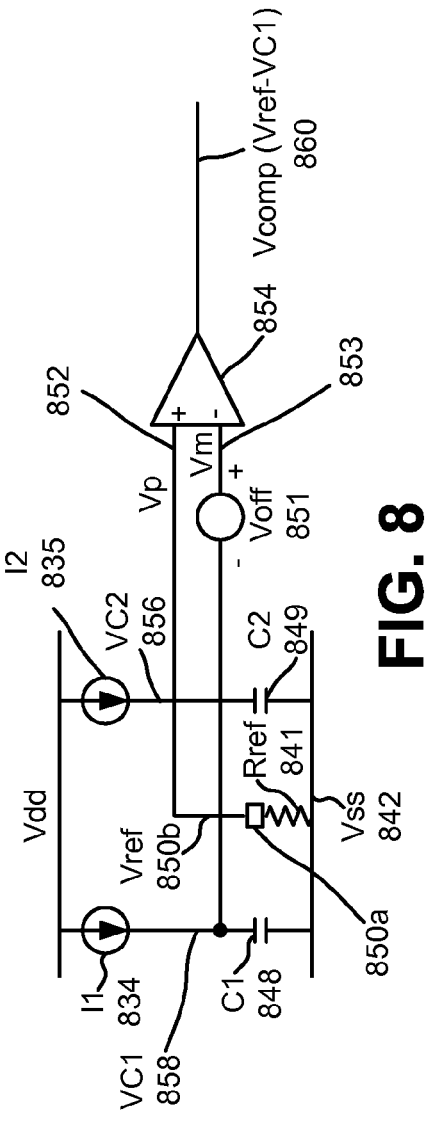

State 5: C2 switched from I2 to ground. Rref switched to I2. Triggered by phi4.

State 6: Vc1 = Vref + epsilon, comparator transition to 0.

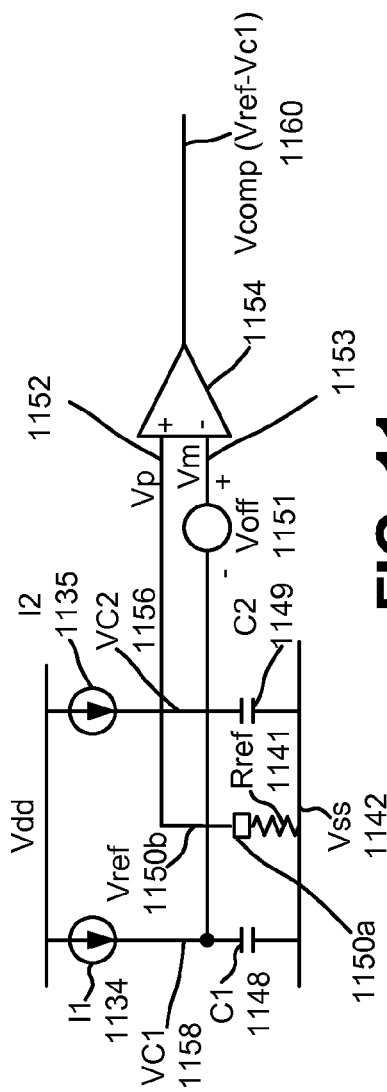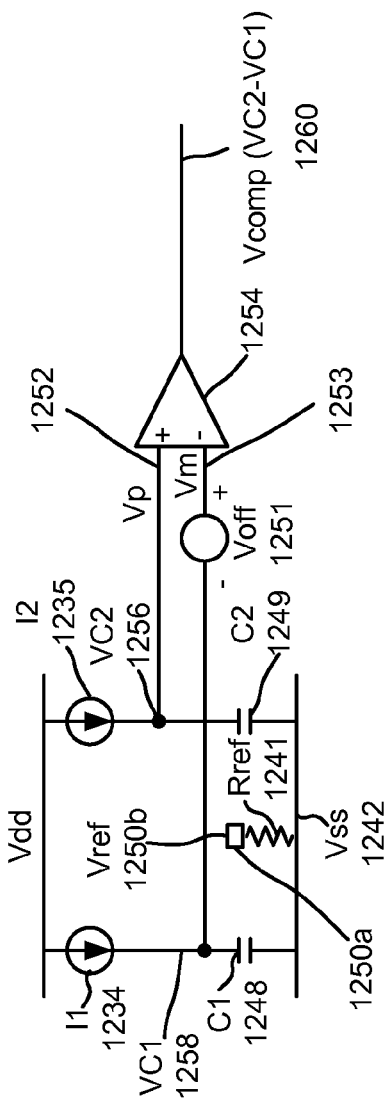

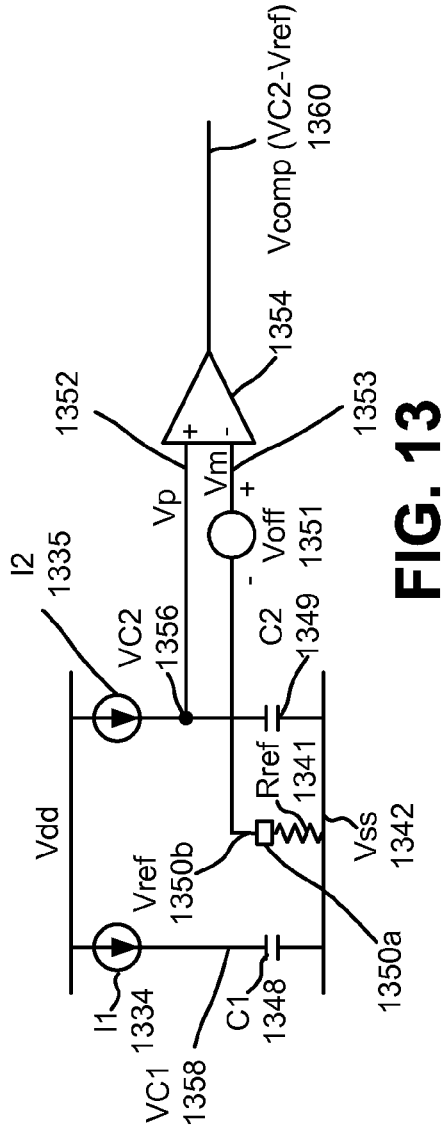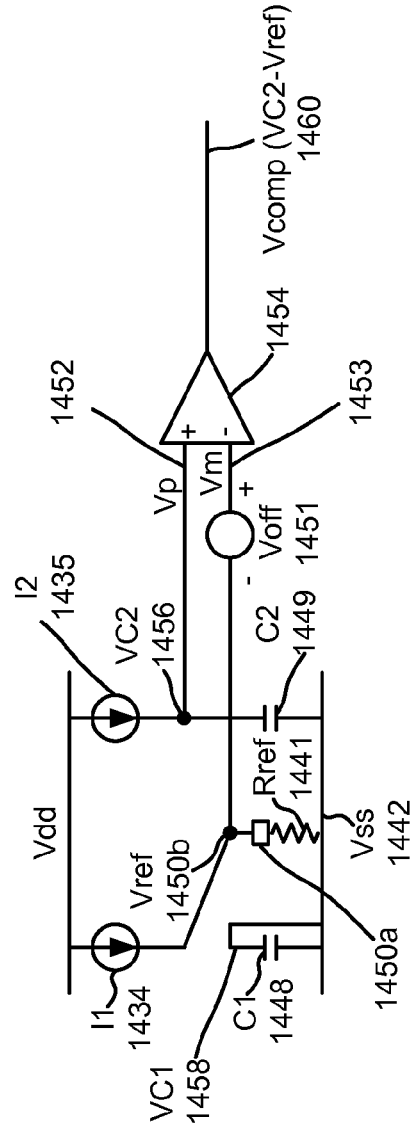

FLICKER NOISE CANCELLATION IN OSCILLATORS

RELATED APPLICATIONS

This application is related to and claims priority from U.S. Provisional Patent Application Ser. No. 61/176,358 filed May 7, 2009, for "Flicker Noise Cancellation In Oscillators," with inventors Sylvain M. Colin, Jun Young Park and Marzio Pedrali-Noy.

TECHNICAL FIELD

The present disclosure relates generally to wireless communication systems. More specifically, the present disclosure relates to systems and methods for flicker noise cancellation in oscillators.

BACKGROUND

Wireless communication devices have become smaller and more powerful in order to meet consumer needs and to improve portability and convenience. Consumers have become dependent upon wireless communication devices such as cellular telephones, personal digital assistants (PDAs), laptop computers, and the like. Consumers have come to expect reliable service, expanded areas of coverage, and increased functionality.

A common way to conserve power in a wireless communication device is by placing the electronic device in a low power consumption state (e.g., "sleep mode") when the wireless communication device is not in use. When a wireless communication device is in a sleep mode, a sleep clock may be used to track time and schedule when the wireless communication device "wakes up."

Clocks traditionally include a resonator-based oscillator, such as a low frequency crystal oscillator (e.g., the 32 kilohertz (kHz) oscillator commonly found in wristwatches). However, the size and cost of crystal oscillators make them ill-suited for mass produced microsystems. Relaxation oscillators may be used in a sleep mode instead of a resonator-based oscillator. However, non-resonator based oscillators, such as relaxation oscillators, may exhibit jitter that is higher than the jitter exhibited by resonator-based oscillators for the same level of power consumption. Jitter is the time variation of the clock signal period versus time. Jitter may be caused by various noise sources.

The jitter of a circuit may be caused by jitter due to thermal noise of the circuit and jitter due to flicker noise of the circuit. Various solutions have been proposed to reduce jitter due to thermal noise in a relaxation oscillator, which has been found to be inversely proportional to the reference voltage of the relaxation oscillator. However, such proposed circuits do not address jitter due to flicker noise.

Jitter due to flicker noise is commonly reduced by increasing the size of the transistors in the circuit. However, increasing the size of the transistors in the circuit may not be feasible for mass produced microsystems. Further, the additional capacitance due to the larger transistors may reduce the speed of the circuit and increase the charge injection of the circuit. Benefits may be realized by improvements to relaxation oscillators that reduce the jitter due to flicker noise.

SUMMARY

A method for flicker noise cancellation in an oscillator is described. A first current source is selectively coupled to a first capacitor of the oscillator during a first time period of an oscillation period of the oscillator. The first current source is selectively coupled to a reference node of the oscillator during a second time period of the oscillation period.

Current produced by the first current source may be affected by flicker noise in the oscillator. The oscillator may not include a crystal. The oscillator may be a relaxation oscillator. The first current source may be selectively coupled to the first capacitor and to the reference node via a switch. The reference node may be coupled to a resistor. A sum of the first time period and the second time period may be substantially equal to the oscillation period.

A second current source may be selectively coupled to a second capacitor of the oscillator during a third time period of the oscillation period. The second current source may be selectively coupled to the reference node during a fourth time period of the oscillation period. A sum of the third time period and the fourth time period may be substantially equal to the oscillation period.

The first capacitor may be selectively coupled to a first input of a comparator of the oscillator. The second capacitor may be selectively coupled to a second input of the comparator. The reference node may be selectively coupled to the first input or the second input. At least one of the first capacitor and the second capacitor may be coupled to the comparator.

An oscillator is described. The oscillator includes a first capacitor, a reference node and a controller configured to selectively couple a first current source to the first capacitor during a first time period and to selectively couple the first current source to the reference node during a second time period.

The oscillator may not include a crystal. The controller may include a switch. The reference node may be coupled to a resistor. A sum of the first time period and the second time period may be substantially equal to an oscillation period of the oscillator. Current produced by the first current source may be affected by flicker noise in the oscillator.

The oscillator may include a second capacitor and a second controller. The second controller may be configured to selectively couple a second current source to the second capacitor during a third time period and to selectively couple the second current source to the reference node during a fourth time period. A sum of the third time period and the fourth time period may be substantially equal to an oscillation period of the oscillator.

The oscillator may also include a comparator that includes a first input and a second input. The comparator may include logic to selectively couple the first capacitor to the first input and the reference node to the second input. The comparator may also include logic to selectively couple the reference node to the first input and the second capacitor to the second input. The comparator may further include logic to selectively couple the first capacitor to the first input and the second capacitor to the second input.

An oscillator is also described. The oscillator includes a first capacitor, a second capacitor, a first current source, a second current source, and a comparator that has a first input and a second input. The oscillator also includes a reference node, and a controller that is configured to selectively couple the first current source to the first capacitor and the second current source to the reference node during a first time period.

The controller may be configured to selectively couple the first current source to the reference node and the second current source to the second capacitor during a second time period. A sum of the first time period and the second time period may be substantially equal to an oscillation period of the oscillator. The controller may be configured to selectively couple the first current source to the first capacitor and the second current source to the second capacitor during a third time period. The oscillator may include a reference resistor. The reference node may be coupled to the reference resistor.

The controller may include a first switch, a second switch, a third switch, a fourth switch, a fifth switch, and a sixth switch. The controller may cycle the oscillator through multiple states using five configurations of the switches to reduce flicker noise in the oscillator. The first switch and the second switch may be responsive to a first phase generated by a phase generator. The third switch may be responsive to a second phase generated by the phase generator. The fourth switch may be responsive to a third phase generated by the phase generator. The fifth switch and the sixth switch may be responsive to a fourth phase generated by the phase generator.

The phase generator may be controlled by an output of the comparator. A rising edge of the output of the comparator may trigger a rising edge of the first phase followed by a rising edge of the second phase followed by a rising edge of the third phase followed by a rising edge of the fourth phase. A falling edge of the output of the comparator triggers a falling edge of the fourth phase followed by a falling edge of the third phase followed by a falling edge of the second phase followed by a falling edge of the first phase.

The first switch may selectively couple the first current source and the first input of the comparator. The second switch may selectively couple the first capacitor to ground in a first position and to the first current source in a second position. The third switch may selectively couple the first input of the comparator to the reference node in a first position and to the first capacitor in a second position. The fourth switch may selectively couple the second input of the comparator to the second current source in a first position and to the reference node in a second position. The fifth switch may selectively couple the second capacitor to the second current source in a first position and to ground in a second position. The sixth switch may selectively couple the reference node to the second current source.

A first configuration of the switches may include the first switch closed, the second switch in the first position, the third switch in the first position, the fourth switch in the first position, the fifth switch in the first position and the sixth switch open. A second configuration of the switches may include the first switch open, the second switch in the second position, the third switch in the first position, the fourth switch in the first position, the fifth switch in the first position, and the sixth switch open. A third configuration of the switches may include the first switch open, the second switch in the second position, the third switch in the second position, the fourth switch in the first position, the fifth switch in the first position and the sixth switch open.

A fourth configuration of the switches may include the first switch open, the second switch in the second position, the third switch in the second position, the fourth switch in the second position, the fifth switch in the first position, and the sixth switch open. A fifth configuration of the switches may include the first switch open, the second switch in the second position, the third switch in the second position, the fourth switch in the second position, the fifth switch in the second position and the sixth switch closed. The oscillator may be a relaxation oscillator. The oscillator may be used in a wireless communication device.

A method for flicker noise cancellation in an oscillator is described. A comparator is selectively configured with one of a first configuration, a second configuration, a third configuration, a fourth configuration or a fifth configuration. The comparator may have a first input and a second input. Components of the oscillator are cycled through multiple states using a controller. The components of the oscillator include a first current source, a second current source, a first capacitor, a second capacitor and a reference node. Cycling the components of the oscillator through multiple states causes the oscillator to oscillate with reduced flicker noise.

The controller may be configured to selectively couple the first current source to the first capacitor during a first time period and to selectively couple the first current source to the reference node during a second time period. A sum of the first time period and the second time period may be substantially equal to an oscillation period of the oscillator. The controller may be configured to selectively couple the second current source to the second capacitor during a third time period and to selectively couple the second current source to the reference node during a fourth time period. A sum of the third time period and the fourth time period may be substantially equal to an oscillation period of the oscillator.

The oscillator may also include a reference resistor. The reference node may be coupled to the reference resistor. The controller may include a first switch, a second switch, a third switch, a fourth switch, a fifth switch and a sixth switch. The controller may cycle the oscillator through multiple states using five configurations of the switches to reduce flicker noise in the oscillator.

Cycling the components of the oscillator through multiple states may include coupling the first current source to the reference node, coupling the second current source to the first capacitor and comparing a voltage across the first capacitor with a voltage at the reference node plus the offset voltage. A low clock signal may be output if the voltage across the first capacitor is not greater than the voltage at the reference node plus the offset voltage. A high clock signal may be output if the voltage across the first capacitor is greater than the voltage at the reference node plus the offset voltage.

Cycling the components of the oscillator through multiple states may also include opening the first switch, moving the second switch from a first position to a second position, coupling the first current source to the second capacitor, moving the third switch from a first position to a second position, moving the fourth switch from a first position to a second position, moving the fifth switch from a first position to a second position, closing the sixth switch and comparing a voltage at the reference node with a voltage across the first capacitor plus the offset voltage. A high clock signal may be output if the voltage at the reference node is not greater than the voltage across the first capacitor plus the offset voltage. A low clock signal may be output if the voltage at the reference node is greater than the voltage across the first capacitor plus the offset voltage.

Cycling the components of the oscillator through multiple states may further include opening the sixth switch, moving the fifth switch from the second position to the first position, moving the fourth switch from the second position to the first position, moving the third switch from the second position to the first position, moving the second switch from the second position to the first position and closing the first switch.

An apparatus for flicker noise cancellation in an oscillator is described. The apparatus includes means for selectively configuring a comparator with one of a first configuration, a second configuration, a third configuration, a fourth configuration and a fifth configuration. The comparator has a first input and a second input. The apparatus also includes means for cycling components of the oscillator through multiple states using a controller. The components of the oscillator include a first current source, a second current source, a first capacitor, a second capacitor and a reference node. Cycling the components of the oscillator through multiple states causes the oscillator to oscillate with reduced flicker noise.

BRIEF DESCRIPTION OF THE DRAWINGS

FIG. 5 is a circuit diagram illustrating a relaxation oscillator with flicker noise cancellation in a first state;

FIG. 6 is a circuit diagram illustrating a relaxation oscillator with flicker noise cancellation in a second state;

FIG. 7 is a circuit diagram illustrating a relaxation oscillator with flicker noise cancellation in a third state;

FIG. 8 is a circuit diagram illustrating a relaxation oscillator with flicker noise cancellation in a fourth state;

FIG. 11 is a circuit diagram illustrating a relaxation oscillator with flicker noise cancellation in a seventh state;

FIG. 12 is a circuit diagram illustrating a relaxation oscillator with flicker noise cancellation in an eighth state;

FIG. 13 is a circuit diagram illustrating a relaxation oscillator with flicker noise cancellation in a ninth state;

FIG. 14 is a circuit diagram illustrating a relaxation oscillator with flicker noise cancellation in a tenth state;

DETAILED DESCRIPTION

Figure 1:
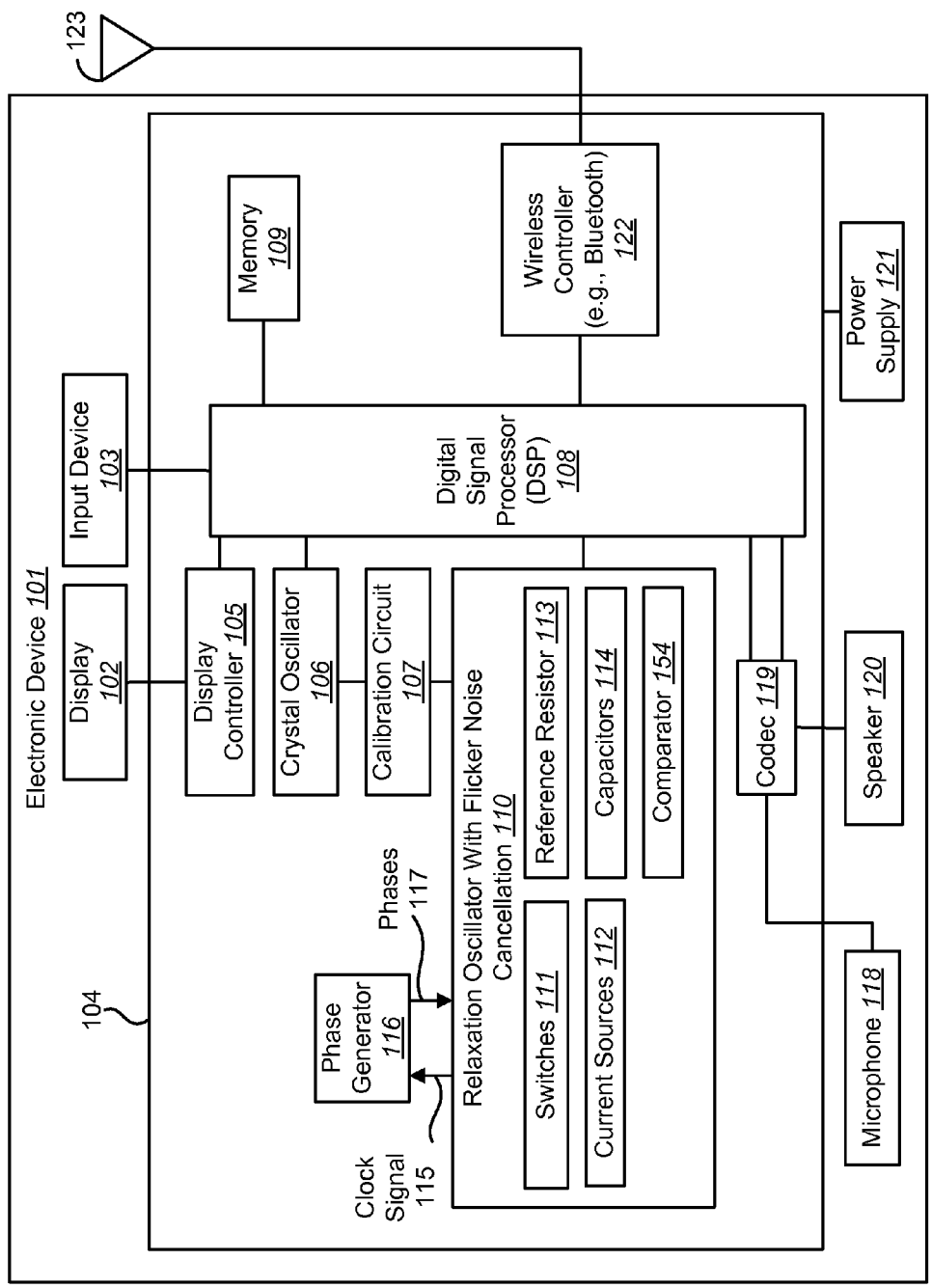
FIG. 1 is a block diagram illustrating an electronic device for use in the present systems and methods.

FIG. 1 is a block diagram illustrating an electronic device 101 for use in the present systems and methods. The electronic device 101 may be a wireless communication device. A wireless communication device may be referred to as a mobile station, a subscriber station, an access terminal, a remote station, a user terminal, a terminal, a subscriber unit, user equipment (UE), etc.

A wireless communication device may communicate with one or more base stations via transmissions on the uplink and the downlink. The uplink (or reverse link) refers to the communication link from the wireless communication device to the base station, and the downlink (or forward link) refers to the communication link from the base station to the wireless communication device. A wireless communication system may simultaneously support communication for multiple wireless communication devices.

Wireless communication systems may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, orthogonal frequency division multiple access (OFDMA) systems, and spatial division multiple access (SDMA) systems.

In one configuration, the electronic device 101 may use Bluetooth. For example, the electronic device 101 may be a Bluetooth headset. Bluetooth is a wireless protocol for exchanging data over short distances from fixed and mobile devices.

The electronic device 101 may include a processor, such as a digital signal processor (DSP) 108, coupled to a memory 109 and also coupled to a crystal oscillator 106 and to a relaxation oscillator 110. The relaxation oscillator 110 may be a crystal-less oscillator. Because the relaxation oscillator 110 does not have a crystal (or any other resonator), the frequency of the relaxation oscillator 110 may vary with process parameters and environmental variables (such as temperature and supply voltage). Furthermore, the oscillation frequency of the relaxation oscillator may exhibit an order of magnitude more jitter for the same current consumption as an oscillator which uses a resonator. The relaxation oscillator 110 may include flicker noise cancellation. The relaxation oscillator 110 is discussed in additional detail below in relation to FIG. 4. The relaxation oscillator 110 may include one or more switches 111, one or more current sources 112, one or more capacitors 114, one or more reference resistors 113, and a comparator 154. In one configuration, the relaxation oscillator 110 may include six switches 111, two current sources 112, two capacitors 114, one reference resistor 113, and a comparator 154.

The crystal oscillator 106 may generate a first clock signal and the relaxation oscillator 110 may generate a second clock signal 115. The crystal oscillator 106 and the relaxation oscillator 110 may each be coupled to a calibration circuit 107. The calibration circuit 107 may calibrate the relaxation oscillator 110 with the first clock signal generated by the crystal oscillator 106.

The electronic device 101 may also include a phase generator 116. The phase generator 116 may receive the second clock signal 115 from the relaxation oscillator 110. The phase generator 116 may then generate one or more phases 117. The phases 117 may be applied to the switches 111 in the relaxation oscillator 110. Depending on the phase 117, a switch 111 may be in either a first position or a second position.

The electronic device 101 may include a display controller 105 that is coupled to the digital signal processor 108 and to a display 102. A coder/decoder (CODEC) 119 may also be coupled to the digital signal processor 108. A speaker 120 and a microphone 118 may be coupled to the CODEC 119.

The electronic device 101 may also include a wireless controller 122. The wireless controller 122 (e.g., a Bluetooth controller) may be coupled to the digital signal processor 108 and to a wireless antenna 123. In one configuration, the DSP 108, the display controller 105, the memory 109, the CODEC 119, the wireless controller 122, the oscillators 106 and 110, and the calibration circuit 107 may be included in a system-in-package or system-on-chip 104. An input device 103 and a power supply 121 may be coupled to the on-chip system 104. The display 102, the input device 103, the speaker 120, the microphone 118, the wireless antenna 123, and the power supply 121 may be external to the on-chip system 104. However, each can be coupled to a component of the on-chip system 104, such as an interface or a controller.

Figure 2:
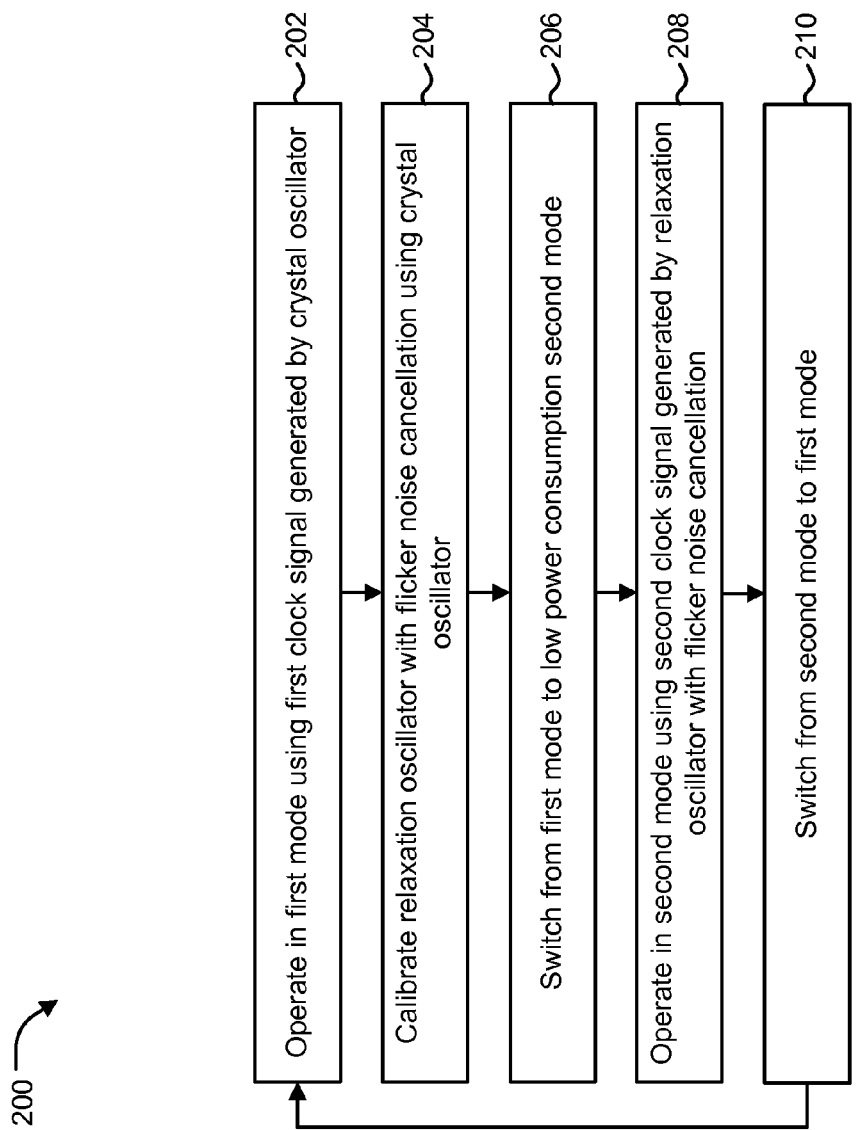
FIG. 2 is a flow diagram of a method for operating an electronic device that includes a relaxation oscillator with flicker noise cancellation.

FIG. 2 is a flow diagram of a method 200 for operating an electronic device 101 that includes a relaxation oscillator 110 with flicker noise cancellation. The method 200 may be performed by an electronic device 101. The electronic device 101 may include a crystal oscillator 106 and a relaxation oscillator 110. The relaxation oscillator 110 may be a crystal-less oscillator. The relaxation oscillator 110 may include flicker noise cancellation. The electronic device 101 may operate 202 in a first mode using a first clock signal generated by the crystal oscillator 106. In one configuration, the first mode may be a powered-on or full-power mode.

The electronic device 101 may then calibrate 204 the relaxation oscillator 110 using the crystal oscillator 106. The relaxation oscillator 110 may be calibrated by a calibration circuit 107 using the crystal oscillator 106. The relaxation oscillator 110 may be configured to selectively couple a first current source I1 to a first capacitor C1 during a first time period and to selectively couple the first current source I1 to a reference node during a second time period. The electronic device 101 may switch 206 from the first mode to a second mode. In one configuration, the second mode may be a low power consumption mode. For example, the second mode may be a "sleep" mode. The electronic device 101 may then operate 208 in the second mode using a second clock signal 115 generated by the relaxation oscillator 110 with flicker noise cancellation. While in the second mode, one or more components of the electronic device 101 may use the second clock signal 115.

The electronic device 101 may switch 210 from the second mode to the first mode. For example, the electronic device 101 may switch 210 from "sleep" mode to "awake" mode. The electronic device 101 may then operate 202 in the first mode using the first clock signal generated by the crystal oscillator 106. The method of FIG. 2 may enable the electronic device 101 to operate using a crystal oscillator 106 during normal operation and a crystal-less relaxation oscillator 110 during low power consumption mode. Enabling the use of crystal-less relaxation oscillators 110 in electronic devices 101 may result in reductions to both the size of the electronic devices 101 as well as the manufacturing costs of the electronic devices 101.

Figure 3:
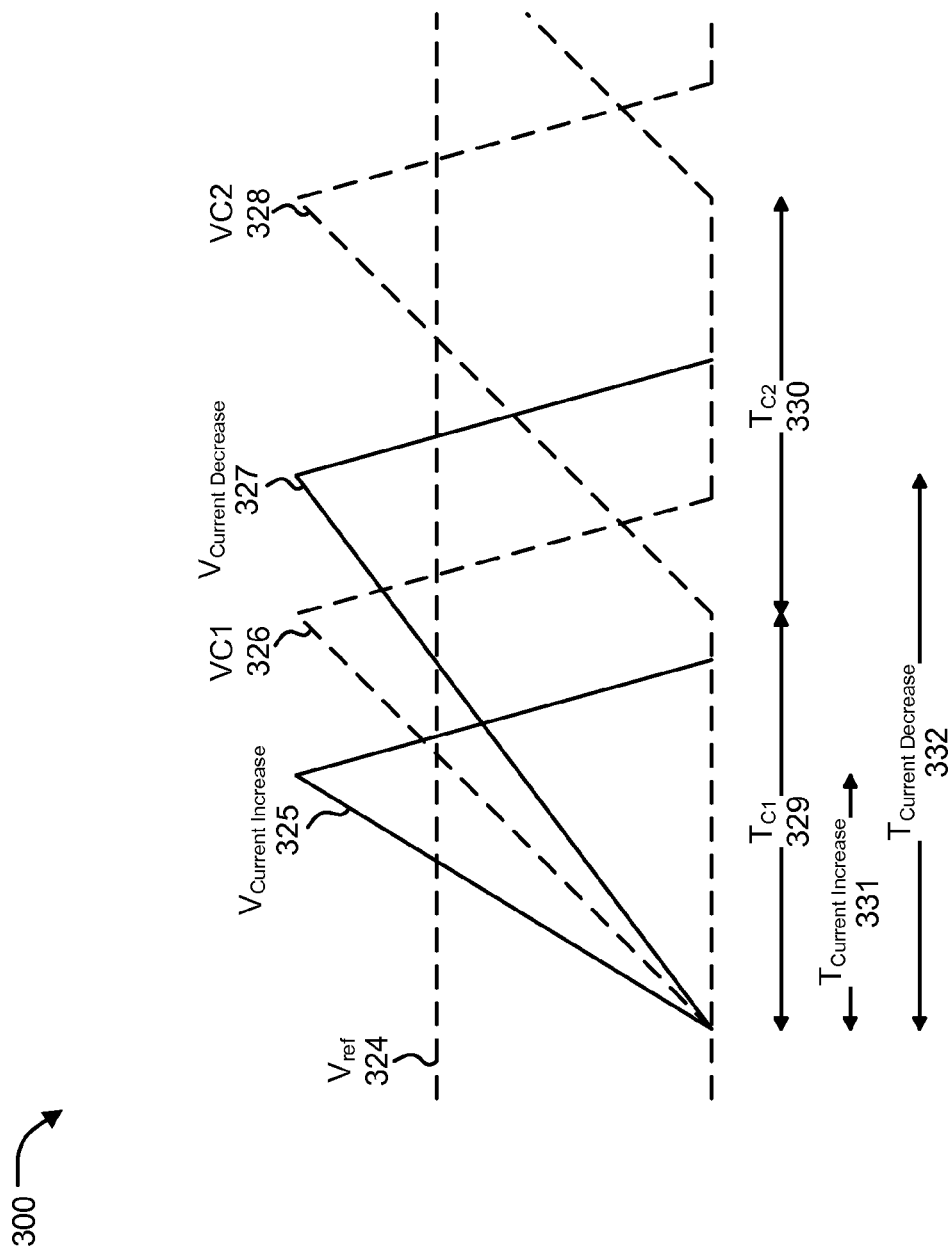
FIG. 3 is a voltage and timing diagram illustrating flicker noise effects in a relaxation oscillator with a first capacitor C1 and a second capacitor C2.

FIG. 3 is a voltage and timing diagram 300 illustrating flicker noise effects in a relaxation oscillator 110 with a first capacitor C1 and a second capacitor C2. The dashed lines Vref 324, VC1 326, and VC2 328 illustrate timing and voltages for a relaxation oscillator 110 not affected by flicker noise. Under ideal conditions, the time TC1 329 to charge the first capacitor C1 (depicted by the voltage curve VC1 326) and the time TC2 330 to charge the second capacitor C2 (depicted by the voltage curve VC2 328) of the relaxation oscillator 110 are constant. In other words, TC1 329 and TC2 330 do not vary across oscillation periods and the voltage curves VC1 326 and VC2 328 are of consistent slope across oscillation periods.

Relaxation oscillators 110 may be affected by flicker noise. Flicker noise in a relaxation oscillator 110 may cause variations in the current applied to the capacitors of the relaxation oscillator 110. When a relaxation oscillator 110 is affected by flicker noise, the capacitors in the relaxation oscillator 110 may charge faster or slower than in ideal conditions. For example, when flicker noise causes an increase in the current charging the first capacitor C1, the first capacitor C1 may charge to the maximum voltage (as depicted by the voltage curve Vcurrentincrease 325) in a shorter time period Tcurrentincrease 331 than TC1 329. Similarly, when flicker noise causes a decrease in the current charging the first capacitor C1, the first capacitor C1 may charge to the maximum voltage (as depicted by the voltage curve Vcurrentdecrease 327) in a longer time period Tcurrentdecrease 332 than TC1 329.

Flicker noise in a relaxation oscillator 110 may be approximated as a slowly varying offset that is essentially constant over a few periods of oscillation with a variation over many periods of oscillation. The sum of the current noise generated by a first current source I1 and a second current source I2 feeding two capacitors of value C of a relaxation oscillator may be referred to as Inc. The current noise injected in a reference node of the relaxation oscillator 110 may be referred to as Inref. The effect of the current noise on the frequency of the relaxation oscillator 110 may be modeled using Equation (1):

$$f_0(\text{no noise}) = \frac{I_{Cref}}{2CV_{ref}} = \frac{I_{Cref}}{2CR_{ref}I_{Rref}}. \qquad (1)$$

In Equation (1), $f_0$(no noise) is the frequency of the relaxation oscillator 110 when there is no noise, $I_{Cref}$ is the current at a reference node, $V_{ref}$ is the voltage of the reference node, and $R_{ref}$ is the resistance at the reference node. With the presence of noise, the frequency of the relaxation oscillator 110 may be modeled using Equation (2):

$$f_0(\text{In}) = \frac{I_{Cref} + Inc}{2CR_{ref}(I_{Rref} + Inref)}. \qquad (2)$$

Flicker noise in a relaxation oscillator 110 may be generally attributable to two sources: flicker noise due to current sources 112 in the relaxation oscillator 110 and flicker noise due to a comparator 154 in the relaxation oscillator 110.

To cancel the impact of flicker noise due to current sources 112 on the period timing of a relaxation oscillator 110, a first current source I1 and a second current source I2 in the relaxation oscillator 110 may each alternate feeding a reference resistance Rref 113. When not feeding the reference resistance Rref 113, the first current source I1 may feed a first capacitor C1 and the second current source I2 may feed a second capacitor C2.

In a first half period, the first current source I1 may feed C1 while the second current source I2 feeds Rref. In a second half period, the first current source I1 may feed Rref while the second current source I2 feeds C2. Since the current noise may be approximated as constant over one time period, the error introduced by the flicker noise of the first current source I1 on the charging time of the first capacitor during the first half period may be compensated for during the second half period by the error generated on Vref. Quantitatively, the first half period T1 may be expressed using Equation (3):

$$T_1 = \frac{CR(I_{ref} + I_{n1})}{(I_{ref} + I_{n2})}. \qquad (3)$$

Quantitatively, the second half period T2 may be expressed using Equation (4):

$$T_2 = \frac{CR(I_{ref} + I_{n2})}{(I_{ref} + I_{n1})}. \qquad (4)$$

The first half period T1 and the second half period T2 may be summed and approximated by a first order Taylor series development with $$x_1 = \frac{I_{n1}}{I_{ref}} \text{ and } x_2 = \frac{I_{n2}}{I_{ref}}$$

to arrive at Equation (5):

$$T_1+T_2=2RC(1-x_1x_2). \qquad (5)$$

Thus, the flicker noise contribution of all the current sources in the relaxation oscillator 110 (i.e., I1, I2, and Iref) may be cancelled to the first order. This method may be referred to as current source flicker noise cancellation (IFC).

Flicker noise due to the comparator 154 in a relaxation oscillator 110 may be approximated by a slowly varying offset voltage at the input of the comparator 154 with very little variation over a few time periods. To cancel the effect of the noise from the comparator 154, the comparator offset voltage may be applied to the capacitor voltage (from C1 or C2) during the first half period T1 of the oscillation period and to the reference voltage (from Rref) during the second half period T2 of the oscillation period. Thus, the flicker noise contribution of the comparator 154 may also be cancelled to the first order. This method may be called comparator flicker noise cancellation (CFC).

Figure 4:
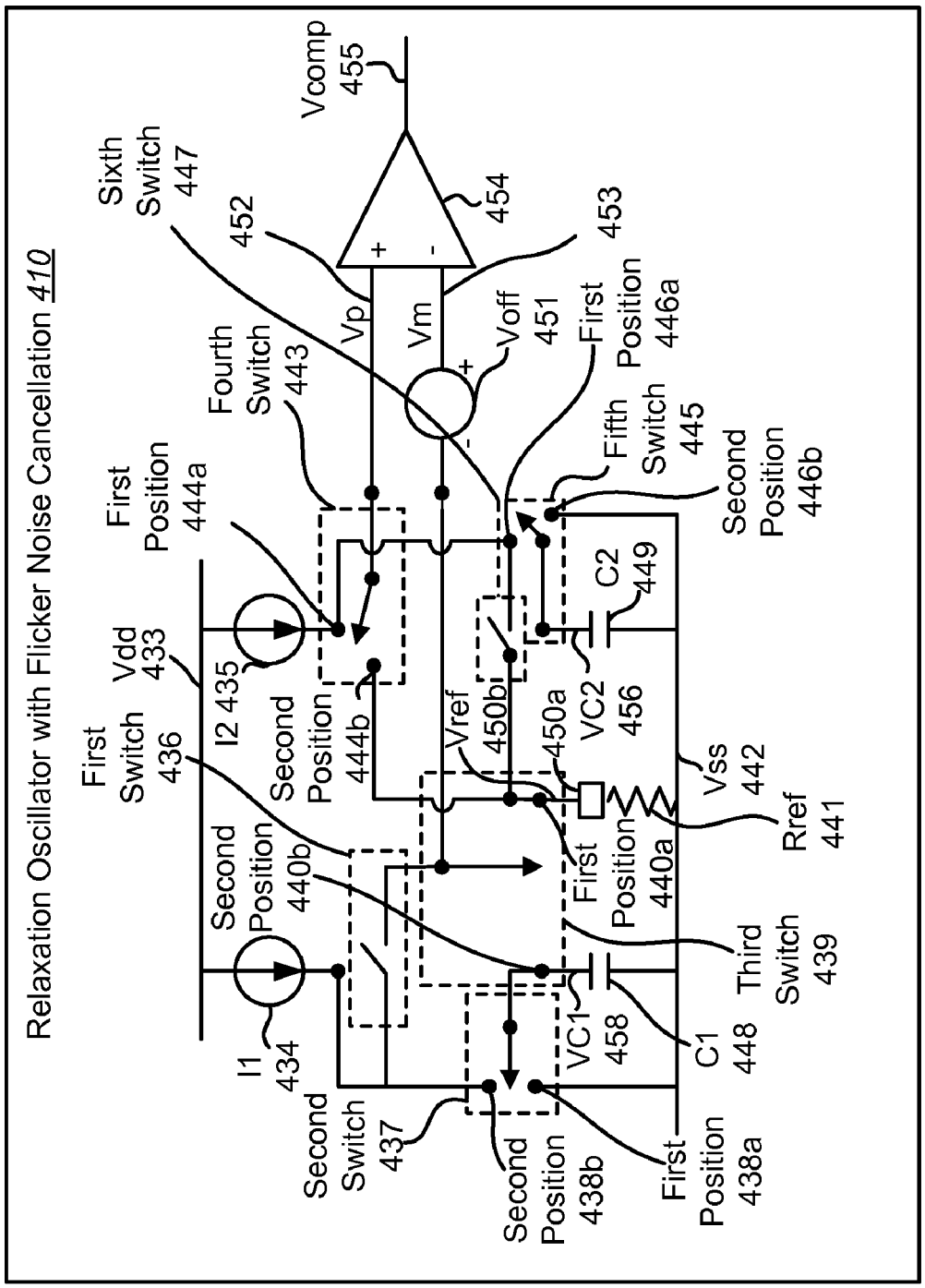
FIG. 4 is a circuit diagram illustrating a relaxation oscillator with flicker noise cancellation.

To implement IFC and CFC in a relaxation oscillator 110, one comparator 154 and two current sources 112 may be used in the configuration shown in FIG. 4. However, IFC and CFC may be implemented using other circuits, such as with one capacitor and two reference voltages. Furthermore, although ten different states for the relaxation oscillator 110 with flicker noise cancellation are shown in FIGS. 5-14 involving switching current source 112 outputs in the oscillator first, followed by switching the comparator 154 inputs, in alternative configurations, the comparator 154 inputs may be switched first, followed by the switching of the current source 112 outputs in the relaxation oscillator 110.

FIG. 4 is a circuit diagram illustrating a relaxation oscillator 410 with flicker noise cancellation. The relaxation oscillator 410 of FIG. 4 may be one configuration of the relaxation oscillator 110 of FIG. 1. The relaxation oscillator 410 circuit may include a first current source I1 434, a second current source I2 435, a first capacitor C1 448, a second capacitor C2 449, a reference resistor Rref 441, a reference node 450a, and a comparator 454. The voltage across C1 448 may be designated by VC1 458. The voltage across C2 449 may be designated by VC2 456.

The comparator 454 may accept a first input 453 (designated by voltage Vm) and a second input 452 (designated by voltage Vp). The comparator 454 may also generate an output signal Vcomp 455. The output signal Vcomp 455 may either be a logic high value or a logic low value. The output signal Vcomp 455 may be the clock signal 115 output by the relaxation oscillator 410. The capacitors C1 448 and C2 449 and the reference resistor Rref 441 may each be coupled to a negative voltage supply Vss 442. The negative voltage supply Vss 442 may be ground. The first current source I1 434 and the second current source I2 435 may each travel in a direction away from a positive voltage supply Vdd 433.

As described above in relation to FIG. 3, the relaxation oscillator 410 may be affected by flicker noise. As such, the variations due to flicker noise in the relaxation oscillator 410 may be represented by a voltage offset Voff 451 applied to the first input 453 of the comparator 454. To implement flicker noise cancellation (IFC and CFC), the relaxation oscillator 410 circuit may be cycled through ten states, as described herein. The state changes may be accomplished by switches within the relaxation oscillator 410, where the switches change state in response to phases 117 generated by a phase generator 116. The phase generator 116 is discussed in additional detail below in relation to FIG. 17.

A reference node 450a may be coupled to the reference resistor Rref 441. It should be noted that although the reference node 450a is depicted in FIG. 4 as coupled to the reference resistor Rref 441, the reference node 450a may instead be coupled to a circuit element other than a resistor. For example, the reference node 450a may be coupled to a current source or a capacitor. The reference node may have a voltage Vref 450b.

The relaxation oscillator 410 may include six switches. The switches may be referred to as a controller. Thus, a controller may control the relaxation oscillator 110. A first switch 436 may selectively couple the first current source I1 434 with the first input 453 of the comparator 454. The first switch 436 may be responsive to a first phase phi1. Thus, when the first phase phi1 has a rising edge, the first switch 436 may move from a closed position to an open position and when the first phase phi1 has a falling edge, the first switch 436 may move from an open position to a closed position. A second switch 437 may selectively couple the first capacitor C1 448 with either the first current source I1 434 or ground 442. The second switch 437 may be responsive to the first phase phi1. Thus, when the first phase phi1 has a rising edge, the second switch 437 may move from coupling the first capacitor C1 448 with the first current source I1 434 to coupling the first capacitor C1 448 with ground 442. In other words, when the first phase has a rising edge, the second switch 437 may move from a first position 438a to a second position 438b. When the first phase has a falling edge, the second switch 437 may move from coupling the first capacitor C1 448 with ground 442 to coupling the first capacitor C1 448 with the first current source I1 434.

A third switch 439 may selectively couple the first input 453 of the comparator 454 with either the reference node 450a or the first capacitor C1 448. The third switch 439 may be responsive to a second phase phi2. When the second phase phi2 has a rising edge, the third switch 439 may move from coupling the first input 453 of the comparator 454 with the reference node 450a to coupling the first input 453 of the comparator 454 with the first capacitor C1 448. In other words, when the second phase has a rising edge, the third switch 439 may move from a first position 440a to a second position 440b. When the second phase has a falling edge, the third switch 439 may move from coupling the first input Vm 453 of the comparator 454 with the first capacitor C1 448 to coupling the first input 453 of the comparator 454 with the reference node 450a.

A fourth switch 443 may selectively couple the second input 452 of the comparator 454 with either the second current source I2 435 or the reference node 450a. The fourth switch 443 may be responsive to the third phase phi3. When the third phase phi3 has a rising edge, the fourth switch 443 may move from coupling the second input 452 of the comparator 454 with the second current source I2 435 to coupling the second input 452 of the comparator 454 with the reference node 450a. In other words, when the third phase has a rising edge, the fourth switch 443 may move from a first position 444a to a second position 444b. When the third phase has a falling edge, the fourth switch 443 may move from coupling the second input 452 of the comparator 454 with the reference node 450a to coupling the second input 452 of the comparator 454 with the second current source I2 435.

A fifth switch 445 may selectively couple the second capacitor C2 449 with either the second current source I2 435 or ground 442. The fifth switch 445 may be responsive to the fourth phase phi4. When the fourth phase phi4 has a rising edge, the fifth switch 445 may move from coupling the second capacitor C2 449 with the second current source I2 435 to coupling the second capacitor C2 449 with ground 442. In other words, when the fourth phase has a rising edge, the fifth switch 445 may move from a first position 446a to a second position 446b. When the fourth phase has a falling edge, the fifth switch 445 may move from coupling the second capacitor C2 449 with ground 442 to coupling the second capacitor C2 449 with the second current source I2 435.

A sixth switch 447 may selectively couple the reference node 450a with the second current source I2 435. The sixth switch 447 may be responsive to the fourth phase phi4. When the fourth phase phi 4 has a rising edge, the sixth switch 447 may move from an open position to a closed position coupling the reference node 450a with the second current source I2 435. When the fourth phase has a falling edge, the sixth switch 447 may move from the closed position to the open position.

The relaxation oscillator may cycle through ten states illustrated in FIGS. 5-14 during one oscillation period. The resulting output Vcomp 455 of the comparator 454 may be used as a clock signal 115.

FIG. 5 is a circuit diagram illustrating a relaxation oscillator 510 with flicker noise cancellation in a first state. The relaxation oscillator 510 with flicker noise cancellation of FIG. 5 may be one configuration of the relaxation oscillator 410 of FIG. 4. For simplicity, the switches are not shown in FIGS. 5-14. However, FIG. 5 represents the relaxation oscillator 410 of FIG. 4 with the first switch 436 closed, the second switch 437 in the first position 438a, the third switch 439 in the first position 440a, the fourth switch 443 in the first position 444a, the fifth switch 445 in the first position 446a, and the sixth switch 447 open. The positions of the six switches when the relaxation oscillator 510 with flicker noise cancellation is in a first state may be referred to as a first configuration of switches.

Thus, the first capacitor C1 548 may be coupled to ground 542. The voltage across the first capacitor C1 548 may have a voltage curve VC1 558. The first current source I1 534 may be coupled to the first input 553 of the comparator 554 and the first input 553 of the comparator 554 may be coupled to the reference node 550a. The first current source I1 534 may thus create a voltage Vref 550b across the reference resistor 541. Furthermore, the second input 552 of the comparator 554 may be coupled to the second current source I2 535 and the second capacitor C2 549 may be coupled to the second current source I2 535. Thus, the second current source I2 535 may charge the second capacitor C2 549 with a voltage curve VC2 556.

The voltage Vm at the first input 553 of the comparator 554 may be equal to the offset voltage Voff 551 plus the voltage Vref 550b. The voltage Vp at the second input 552 of the comparator 554 may be equal to the voltage VC2 556. The comparator 554 may compare Vm and Vp. The comparator 554 may then output Vcomp(Vp−Vm) 560. When Vp≧Vm, the comparator 554 may output a high logic value for Vcomp 560. When Vp<Vm, the comparator 554 may output a low logic value for Vcomp 560. In the first state, Vp>Vm and the comparator 554 is outputting a high logic value 557 for Vcomp 560.

FIG. 6 is a circuit diagram illustrating a relaxation oscillator 610 with flicker noise cancellation in a second state. The relaxation oscillator 610 with flicker noise cancellation of FIG. 6 may be one configuration of the relaxation oscillator 410 of FIG. 4. The second state of the relaxation oscillator 610 may be triggered by a rising edge of the first phase phi1. In other words, the relaxation oscillator 610 may switch from the first state to the second state when the first phase phi1 has a rising edge.

When the relaxation oscillator 610 is in the second state, the switches may be arranged in a second configuration: the first switch 436 is open, the second switch 437 is in the second position 438b, the third switch 439 is in the first position 440a, the fourth switch 443 is in the first position 444a, the fifth switch 445 is in the first position 446a, and the sixth switch 447 is open. The first current source I1 634 may charge the first capacitor C1 648 with a voltage curve VC1 658 across the first capacitor C1 648 to ground (Vss) 642. Because the reference node 650a is no longer coupled to the first current source I1 634, the reference node voltage Vref 650b across the reference resistor 641 may slowly discharge. The second current source I2 635 may continue to charge the second capacitor C2 649. The voltage Vp at the second input 652 of the comparator 654 may be equal to the voltage VC2 656 across the second capacitor C2 649. The voltage Vm at the first input 653 of the comparator 654 may be equal to the voltage at the reference node Vref 650b plus the voltage offset Voff 651. Because Vp>Vm, the comparator 654 may continue to output 660 a logic high value when the relaxation oscillator 610 is in the second state.

FIG. 7 is a circuit diagram illustrating a relaxation oscillator 710 with flicker noise cancellation in a third state. The relaxation oscillator 710 with flicker noise cancellation of FIG. 7 may be one configuration of the relaxation oscillator 410 of FIG. 4. The third state of the relaxation oscillator 710 may be triggered by a rising edge of the second phase phi2. In other words, the relaxation oscillator 710 may switch from the second state to the third state when the second phase phi2 has a rising edge.

When the relaxation oscillator 710 is in the third state, the switches may be arranged according to a third configuration: the first switch 436 is open, the second switch 437 is in the second position 438b, the third switch 439 is in the second position 440b, the fourth switch 443 is in the first position 444a, the fifth switch 445 is in the first position 446a, and the sixth switch 447 is open. The first current source I1 734 may charge the first capacitor C1 748 with a voltage curve VC1 758. The second current source I2 735 may charge the second capacitor C2 749 with a voltage curve VC2 756. The reference node voltage Vref 750b across the reference resistor 741 between the reference node 750a and ground (Vss) 742 may continue to slowly discharge. The voltage Vm at the first input 753 of the comparator 754 may be equal to the voltage VC1 758 across the first capacitor C1 748 plus the offset voltage Voff 751. The voltage Vp at the second input 752 of the comparator 754 may be equal to the voltage VC2 756 across the second capacitor C2 749. Because Vp>Vm, the comparator 754 may continue to output 760 a logic high value when the relaxation oscillator 710 is in the third state.

FIG. 8 is a circuit diagram illustrating a relaxation oscillator 810 with flicker noise cancellation in a fourth state. The relaxation oscillator 810 with flicker noise cancellation of FIG. 8 may be one configuration of the relaxation oscillator 410 of FIG. 4. The fourth state of the relaxation oscillator 810 may be triggered by a rising edge of the third phase phi3. In other words, the relaxation oscillator 810 may switch from the third state to the fourth state when the third phase phi3 has a rising edge.

When the relaxation oscillator 810 is in the fourth state, the switches may be arranged according to a fourth configuration: the first switch 436 is open, the second switch 437 is in the second position 438*b*, the third switch 439 is in the second position 440*b*, the fourth switch 443 is in the second position 444*b*, the fifth switch 445 is in the first position 446*a*, and the sixth switch 447 is open. The first current source I1 834 may charge the first capacitor C1 848 with a voltage curve VC1 858. The second current source I2 835 may charge the second capacitor C2 849 with a voltage curve VC2 856. The voltage Vm at the first input 853 of the comparator 854 may be equal to the voltage VC1 858 across the first capacitor C1 848 plus the offset voltage Voff 851. The reference node 850*a* may be coupled to the second input 852 of the comparator 854. Therefore, the voltage Vp at the second input 852 of the comparator 854 may be equal to the voltage across the reference resistor 841 Vref 850*b* to ground (Vss) 842. The reference node voltage Vref 850*b* may continue to slowly discharge. Because Vp>Vm, the comparator 854 may continue to output 860 a logic high value when the relaxation oscillator 810 is in the fourth state.

Figure 9:
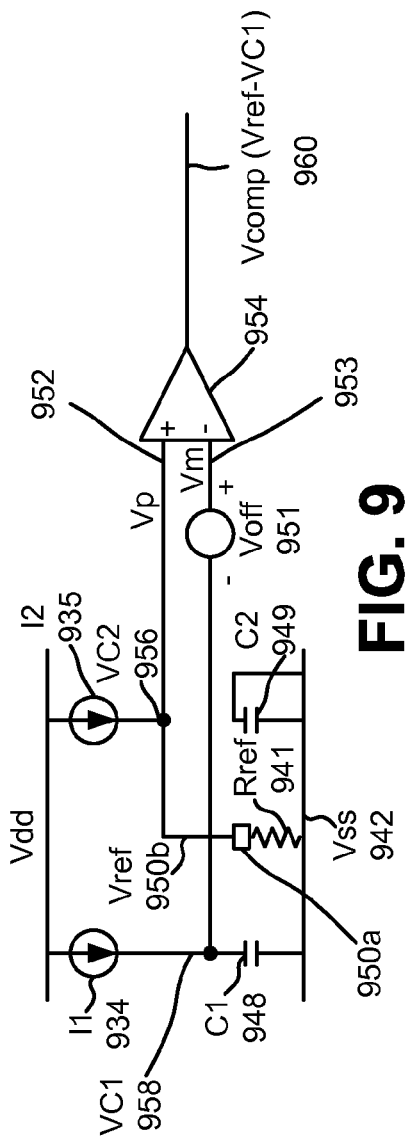
FIG. 9 is a circuit diagram illustrating a relaxation oscillator with flicker noise cancellation in a fifth state.

FIG. 9 is a circuit diagram illustrating a relaxation oscillator 910 with flicker noise cancellation in a fifth state. The relaxation oscillator 910 with flicker noise cancellation of FIG. 9 may be one configuration of the relaxation oscillator 410 of FIG. 4. The fifth state of the relaxation oscillator 910 may be triggered by a rising edge of the fourth phase phi4. In other words, the relaxation oscillator 910 may switch from the fourth state to the fifth state when the fourth phase phi4 has a rising edge.

When the relaxation oscillator 910 is in the fourth state, the switches may be arranged according to a fifth configuration: the first switch 436 is open, the second switch 437 is in the second position 438*b*, the third switch 439 is in the second position 440*b*, the fourth switch 443 is in the second position 444*b*, the fifth switch 445 is in the second position 446*b*, and the sixth switch 447 is closed. The first current source I1 934 may charge the first capacitor C1 948 with a voltage curve VC1 958. The voltage Vm at the first input 953 of the comparator 954 may be equal to the voltage VC1 958 across the first capacitor C1 948 plus the offset voltage Voff 951. The second capacitor C2 949 is connected to ground 942 and may begin to discharge. The voltage across the second capacitor C2 949 may be designated by the voltage curve VC2 956. The second current source I2 935 is connected to the reference node 950*a* and the second input 952 of the comparator 954. The second current source I2 935 may begin inducing a voltage Vref 950*b* across the reference resistor 941. The voltage Vp at the second input 952 of the comparator 954 may be equal to the voltage Vref 950*b* across the reference resistor 941 at the reference node 950*a*. Because Vp>Vm, the comparator 954 may continue to output 960 a logic high value when the relaxation oscillator 910 is in the fifth state.

Figure 10:
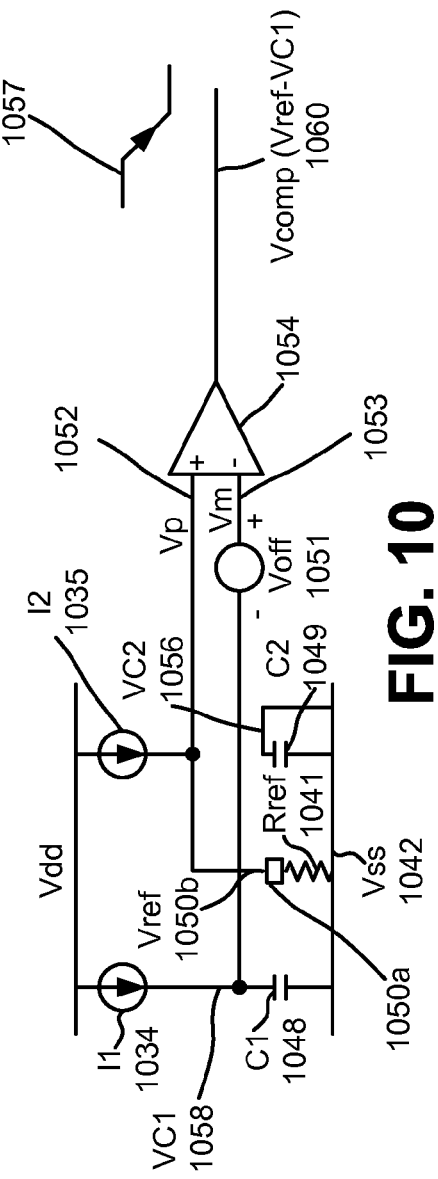
FIG. 10 is a circuit diagram illustrating a relaxation oscillator with flicker noise cancellation in a sixth state.

FIG. 10 is a circuit diagram illustrating a relaxation oscillator 1010 with flicker noise cancellation in a sixth state. The relaxation oscillator 1010 with flicker noise cancellation of FIG. 10 may be one configuration of the relaxation oscillator 410 of FIG. 4. The sixth state of the relaxation oscillator 1010 may be triggered by the comparator 1054. When the voltage Vm at the first input 1053 of the comparator 1054 becomes greater than the voltage Vp at the second input 1052 of the comparator 1054 (which occurs while the relaxation oscillator 910 is in the fifth state), the output 1060 of the comparator 1054 may switch 1057 from outputting a logic high value to outputting a low logic value. Therefore, the sixth state may be triggered by the falling edge of the output 1060 of the comparator 1054. In other words, the relaxation oscillator 1010 may switch from the fifth state to the sixth state when the output 1060 of the comparator 1054 has a falling edge. The sixth state may use the same configuration of switches as those used in the fifth state. Thus, when the relaxation oscillator 1010 is in the sixth state, the switches may be arranged according to the fifth configuration.

The first current source I1 1034 may charge the first capacitor C1 1048 with a voltage curve VC1 1058. The voltage Vm at the first input 1053 of the comparator 1054 may be equal to the voltage VC1 1058 across the first capacitor C1 1048 plus the offset voltage Voff 1051. The second capacitor C2 1049 is connected to ground 1042 and may be discharging. The voltage across the second capacitor C2 1049 may be designated by the voltage curve VC2 1056. The second current source I2 1035 is connected to the reference node 1050*a* and the second input 1052 of the comparator 1054. The second current source I2 1035 may be inducing a voltage Vref 1050*b* across the reference resistor 1041.

FIG. 11 is a circuit diagram illustrating a relaxation oscillator 1110 with flicker noise cancellation in a seventh state. The relaxation oscillator 1110 with flicker noise cancellation of FIG. 11 may be one configuration of the relaxation oscillator 410 of FIG. 4. The seventh state of the relaxation oscillator 1110 may be triggered by the falling edge of the fourth phase phi4. In other words, the relaxation oscillator 1110 may switch from the sixth state to the seventh state when the fourth phase phi4 has a falling edge.

When the relaxation oscillator 1110 is in the seventh state, the switches may be arranged according to the fourth configuration. The first current source I1 1134 may charge the first capacitor C1 1148 with a voltage curve VC1 1158. The second current source I2 1135 may charge the second capacitor C2 1149 with a voltage curve VC2 1156. The voltage Vm at the first input 1153 of the comparator 1154 may be equal to the voltage VC1 1158 across the first capacitor C1 1148 plus the offset voltage Voff 1151. The reference node 1150*a* may be coupled to the second input 1152 of the comparator 1154. Therefore, the voltage Vp at the second input 1152 of the comparator 1154 may be equal to the voltage Vref 1150*b* across the reference resistor 1141. The reference node voltage Vref 1150*b* may slowly discharge to ground (Vss) 1142. Because Vp<Vm, the comparator 1154 may continue to output 1160 a logic low value when the relaxation oscillator 1110 is in the seventh state.

FIG. 12 is a circuit diagram illustrating a relaxation oscillator 1210 with flicker noise cancellation in an eighth state. The relaxation oscillator 1210 with flicker noise cancellation of FIG. 12 may be one configuration of the relaxation oscillator 410 of FIG. 4. The eighth state of the relaxation oscillator 1210 may be triggered by the falling edge of the third phase phi3. In other words, the relaxation oscillator 1210 may switch from the seventh state to the eighth state when the when the third phase phi3 has a falling edge.

When the relaxation oscillator 1210 is in the eighth state, the switches may be arranged according to the third configuration. The first current source I1 1234 may charge the first capacitor C1 1248 with a voltage curve VC1 1258. The second current source I2 1235 may charge the second capacitor C2 1249 with a voltage curve VC2 1256. The voltage Vref 1250*b* across the reference resistor 1241 at the reference node 1250*a* may continue to slowly discharge to ground (Vss) 1242. The voltage Vm at the first input 1253 of the comparator 1254 may be equal to the voltage VC1 1258 across the first capacitor C1 1248 plus the offset voltage Voff 1251. The voltage Vp at the second input 1252 of the comparator 1254 may be equal to the voltage VC2 1256 across the second capacitor C2 1249. Because Vp<Vm, the comparator 1254 may continue to output 1260 a logic low value when the relaxation oscillator 1210 is in the eighth state.

FIG. 13 is a circuit diagram illustrating a relaxation oscillator 1310 with flicker noise cancellation in a ninth state. The relaxation oscillator 1310 with flicker noise cancellation of FIG. 13 may be one configuration of the relaxation oscillator 410 of FIG. 4. The ninth state of the relaxation oscillator 1310 may be triggered by the falling edge of the second phase phi2. In other words, the relaxation oscillator 1310 may switch from the eighth state to the ninth state when the second phase phi2 has a falling edge.

When the relaxation oscillator 1310 is in the ninth state, the switches may be arranged according to the second configuration. The first current source I1 1334 may charge the first capacitor C1 1348 with a voltage curve VC1 1358. The voltage Vref 1350b across the reference resistors 1341 at the reference node 1350a may continue to slowly discharge to ground (Vss) 1342. The second current source I2 1335 may continue to charge the second capacitor C2 1349. The voltage Vp at the second input 1352 of the comparator 1354 may be equal to the voltage VC2 1356 across the second capacitor C2 1349. The voltage Vm at the first input 1353 of the comparator 1354 may be equal to the voltage at the reference node Vref 1350b plus the voltage offset Voff 1351. Because Vp<Vm, the comparator 1354 may continue to output 1360 a logic low value when the relaxation oscillator 1310 is in the ninth state.

FIG. 14 is a circuit diagram illustrating a relaxation oscillator 1410 with flicker noise cancellation in a tenth state. The relaxation oscillator 1410 with flicker noise cancellation of FIG. 14 may be one configuration of the relaxation oscillator 410 of FIG. 4. The tenth state of the relaxation oscillator 1410 may be triggered by the falling edge of the first phase phi1. In other words, the relaxation oscillator 1410 may switch from the ninth state to the tenth state when the first phase phi1 has a falling edge.

When the relaxation oscillator 1410 is in the tenth state, the switches may be arranged according to the first configuration. The first capacitor C1 1448 may be coupled to ground 1442 with a voltage across the first capacitor C1 1448 of VC2 1458, the first current source I1 1434 may be coupled to the first input 1453 of the comparator 1454, and the first input 1453 of the comparator 1454 may be coupled to the reference node 1450a. The first current source I1 1434 may thus create a voltage Vref 1450b across the reference resistor 1441. The second input 1452 of the comparator 1454 may be coupled to the second current source I2 1435 and the second capacitor C2 1449 may be coupled to the second current source I2 1435. Thus, the second current source I2 1435 may charge the second capacitor C2 1449 with a voltage curve VC2 1456.

The voltage Vm at the first input 1453 of the comparator 1454 may be equal to the offset voltage Voff 1451 plus the voltage Vref 1450b. The voltage Vp at the second input 1452 of the comparator 1454 may be equal to the voltage VC2 1456. In the tenth state, Vp<Vm and the comparator 1454 is outputting 1460 a low logic value for Vcomp.

The relaxation oscillator 1410 may switch from the tenth state to the first state once the output 1460 Vcomp of the comparator 1454 switches from outputting a low logic value to outputting a high logic value. Thus, once the voltage Vp at the second input 1452 of the comparator 1454 becomes greater than the voltage Vm at the first input 1453 of the comparator 1454, the relaxation oscillator 1410 may switch from the tenth state to the first state.

Figure 15:
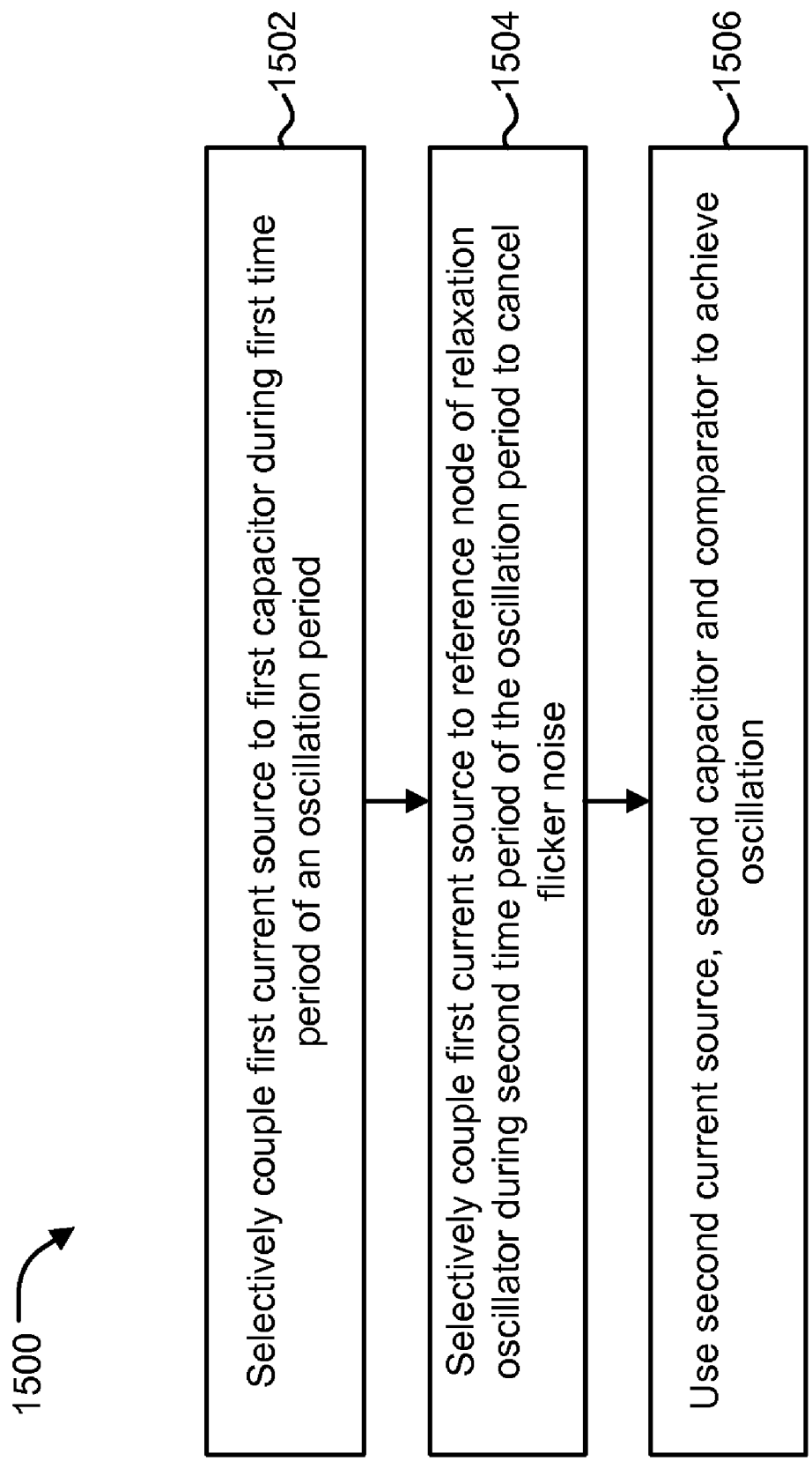
FIG. 15 is a flow diagram of a method for flicker noise cancellation in a relaxation oscillator.

FIG. 15 is a flow diagram of a method 1500 for flicker noise cancellation in a relaxation oscillator 410. The method 1500 may be performed by the relaxation oscillator 410. The relaxation oscillator 410 may selectively couple 1502 a first current source I1 434 to a first capacitor C1 448 during a first time period of an oscillation period. The relaxation oscillator 410 may then selectively couple 1504 the first current source I1 434 to a reference node 450a of the relaxation oscillator 410 during a second time period of the oscillation period to cancel flicker noise. The relaxation oscillator 410 may then use 1506 a second current source I2 435, a second capacitor C2 449 and a comparator 454 to achieve oscillation.

Figure 16:
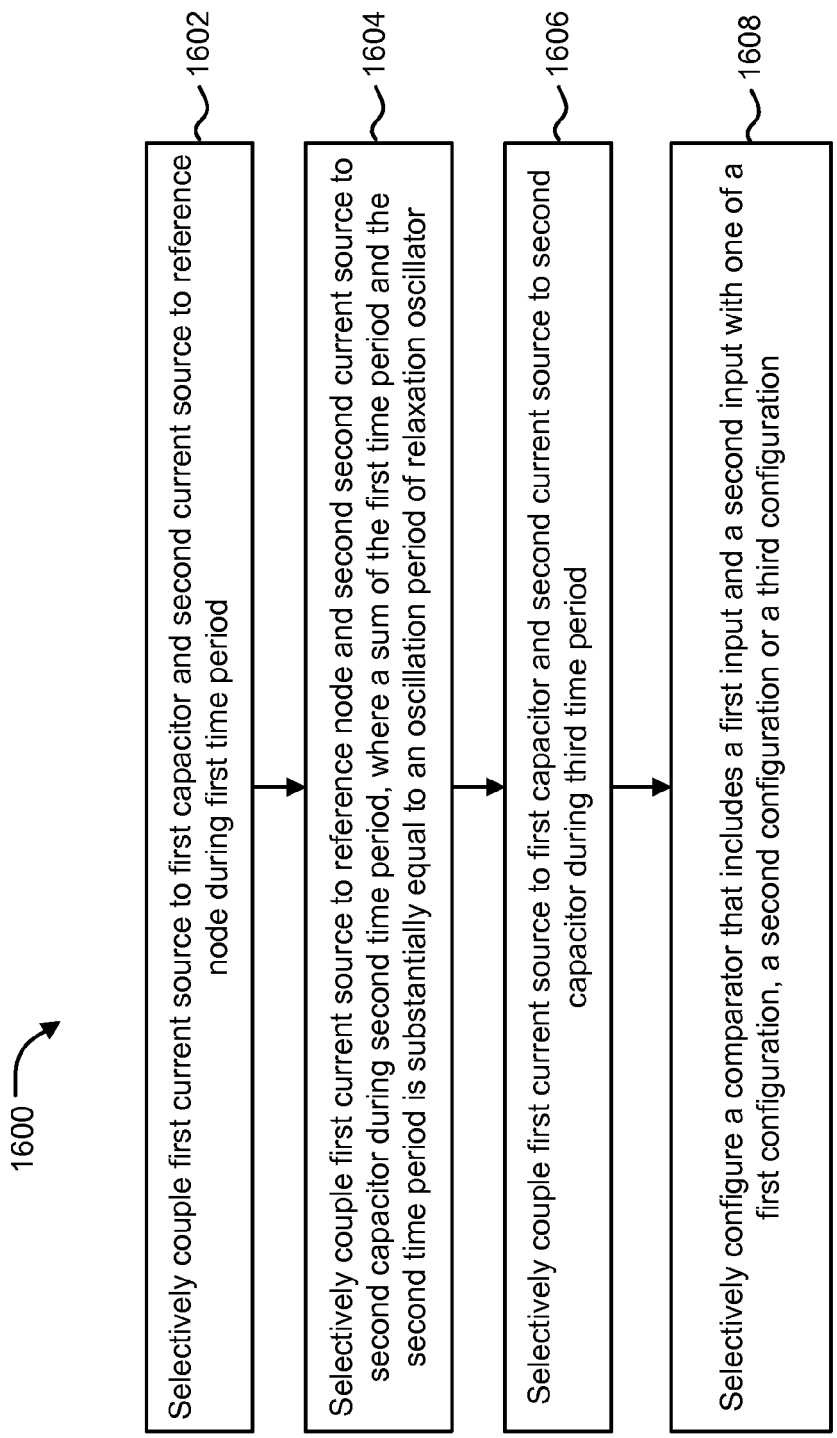
FIG. 16 is a flow diagram of another method for flicker noise cancellation in a relaxation oscillator.

FIG. 16 is a flow diagram of another method 1600 for flicker noise cancellation in a relaxation oscillator 410. The method 1600 may be performed by the relaxation oscillator 410. The relaxation oscillator 410 may selectively couple 1602 a first current source I1 434 to a first capacitor C1 448 and a second current source I2 435 to a reference node 450a during a first time period. The relaxation oscillator 410 may selectively couple 1604 the first current source I1 434 to the reference node 450a and the second current source I2 435 to a second capacitor C2 449 during a second time period. A sum of the first time period and the second time period may be substantially equal to an oscillation period of the relaxation oscillator 410.

The relaxation oscillator 410 may also selectively couple 1606 the first current source I2 435 to the first capacitor C1 4448 during a third time period. The relaxation oscillator 410 may then selectively configure 1610 a comparator 454 that includes a first input 453 and a second input 452 with one of a first configuration, a second configuration or a third configuration. The configurations may refer to the positions of the switches. In the first configuration, the first switch 436 is open, the second switch 437 is in the second position 438b, the third switch 439 is in the second position 440b, the fourth switch 443 is in the second position 444b, the fifth switch 445 is in the second position 446b, and the sixth switch 447 is closed.

In the second configuration, the first switch is 436 closed, the second switch 437 is in the first position 438a, the third switch 439 is in the first position 440a, the fourth switch 443 is in the first position 444a, the fifth switch 445 is in the first position 446a, and the sixth switch 447 is open. In the third configuration, the first switch 436 is open, the second switch 437 is in the second position 438b, the third switch 439 is in the first position 440a, the fourth switch 443 is in the first position 444a, the fifth switch 445 is in the first position 446a, and the sixth switch 447 is open.

Figure 17:
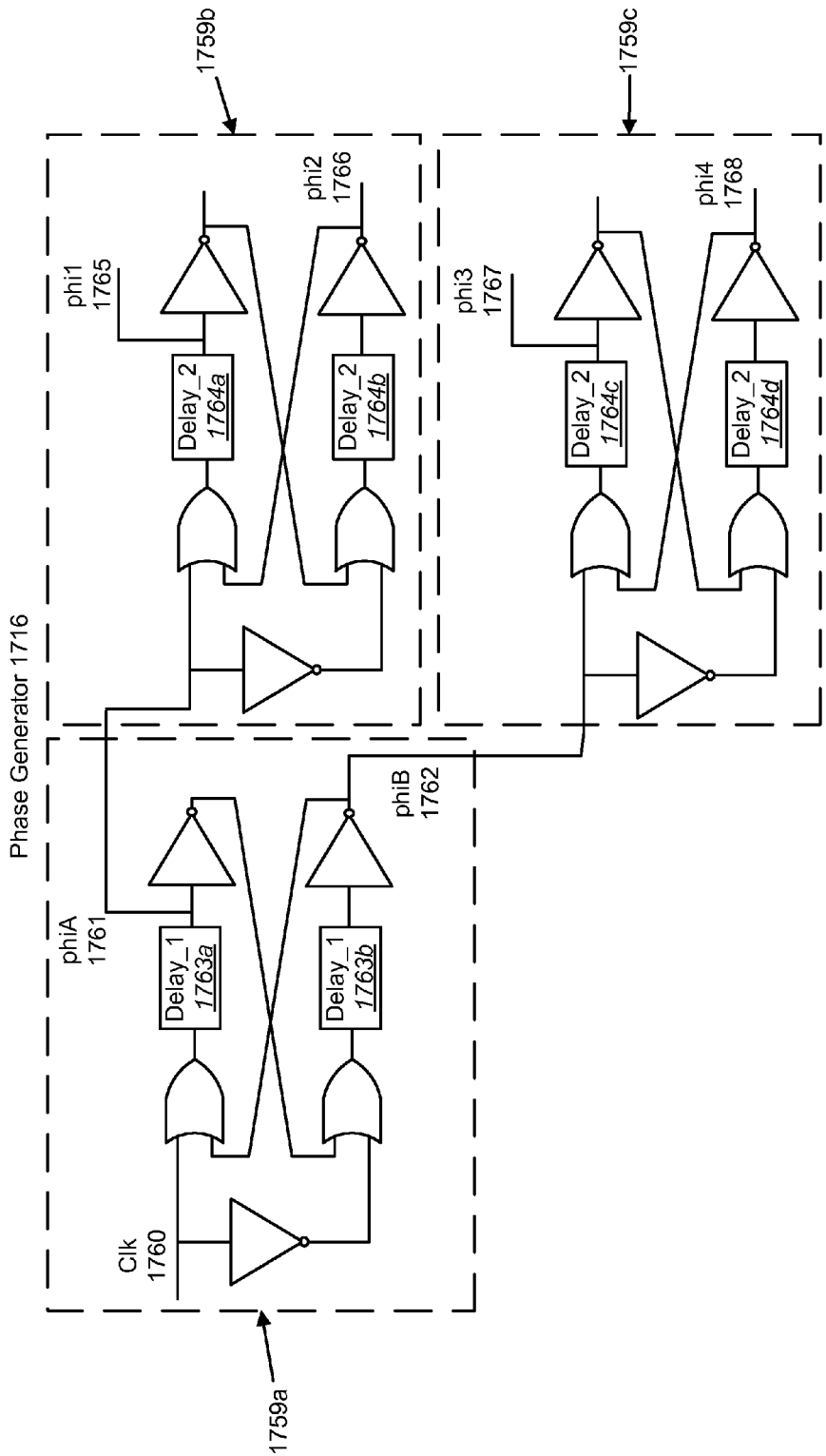
FIG. 17 is a circuit diagram illustrating a phase generator for use in the present systems and methods.

FIG. 17 is a circuit diagram illustrating a phase generator 1716 for use in the present systems and methods. The phase generator 1716 of FIG. 17 may be one configuration of the phase generator 116 of FIG. 1. The phase generator 1716 may be used to generate four phases: a first phase phi1 1765, a second phase phi2 1766, a third phase phi3 1767 and a fourth phase phi4 1768. The generated phases may be used to transition the relaxation oscillator 410 between the ten states illustrates in FIGS. 5-14.

The phase generator 1710 may include three non-overlapping clock signal generators 1759a-c. Each of the non-overlapping clock signal generators 1759 may be configured to accept one input signal and generate two non-overlapping phase signals.

A first non-overlapping clock signal generator 1759a may receive a clock signal 1760 as an input. The clock signal 1760 may be received from the relaxation oscillator 410. Thus, in one configuration, the clock signal 1760 may be received from the output 460 of a comparator 454 within the relaxation oscillator 410. The first non-overlapping clock signal generator 1759a may then generate two non-overlapping intermediate phases phiA 1761 and phiB 1762. The intermediate phase phiA 1761 may be used as an input for a second non-overlapping clock signal generator 1759b. The second non-overlapping clock signal generator 1759b may then generate the first phase phi1 1765 and the second phase phi2 1766. The intermediate phase phiB 1762 may be used as an input for a third non-overlapping clock signal generator 1759c. The third non-overlapping clock signal generator 1759c may then generate the third phase phi3 1767 and the fourth phase phi4 1768.

Each non-overlapping clock signal generator 1759 may include a pair of cross-coupled delay elements. A first cross-coupled delay element 1763a, 1764a, 1764c may be responsive to the input signal and a second cross-coupled delay element 1763b, 1764b, 17647d may be responsive to the inverse of the input signal. For example, in the first non-overlapping clock signal generator 1759a, upon a transition of the input clock signal 1760 from a low value to a high value, the signal phiA 1761 may transition from a low signal to a high signal after a delay Delay_1 1763a. The transition of phiA 1761 may cause a transition of phiB 1762 from a low signal to a high signal after an additional delay of Delay_1 1763b. When the input clock signal 1760 transitions from the high value to the low value, phiB 1762 may transition from a high value to a low value after a delay Delay_1 1763b. The transition of phiB 1762 may cause a transition of phiA 1761 from a high value to a low value after an additional delay of Delay_1 1763a. In one configuration, the delay 1763 in the first non-overlapping clock signal generator 1759a (Delay_1) may be approximately twice the delay 1764 in the second non-overlapping clock signal generator 1759b and the third non-overlapping clock signal generator 1759c (Delay_2) to separate the second phase phi2 1766 and the third phase phi3 1767 by a sufficient margin.

Figure 18:
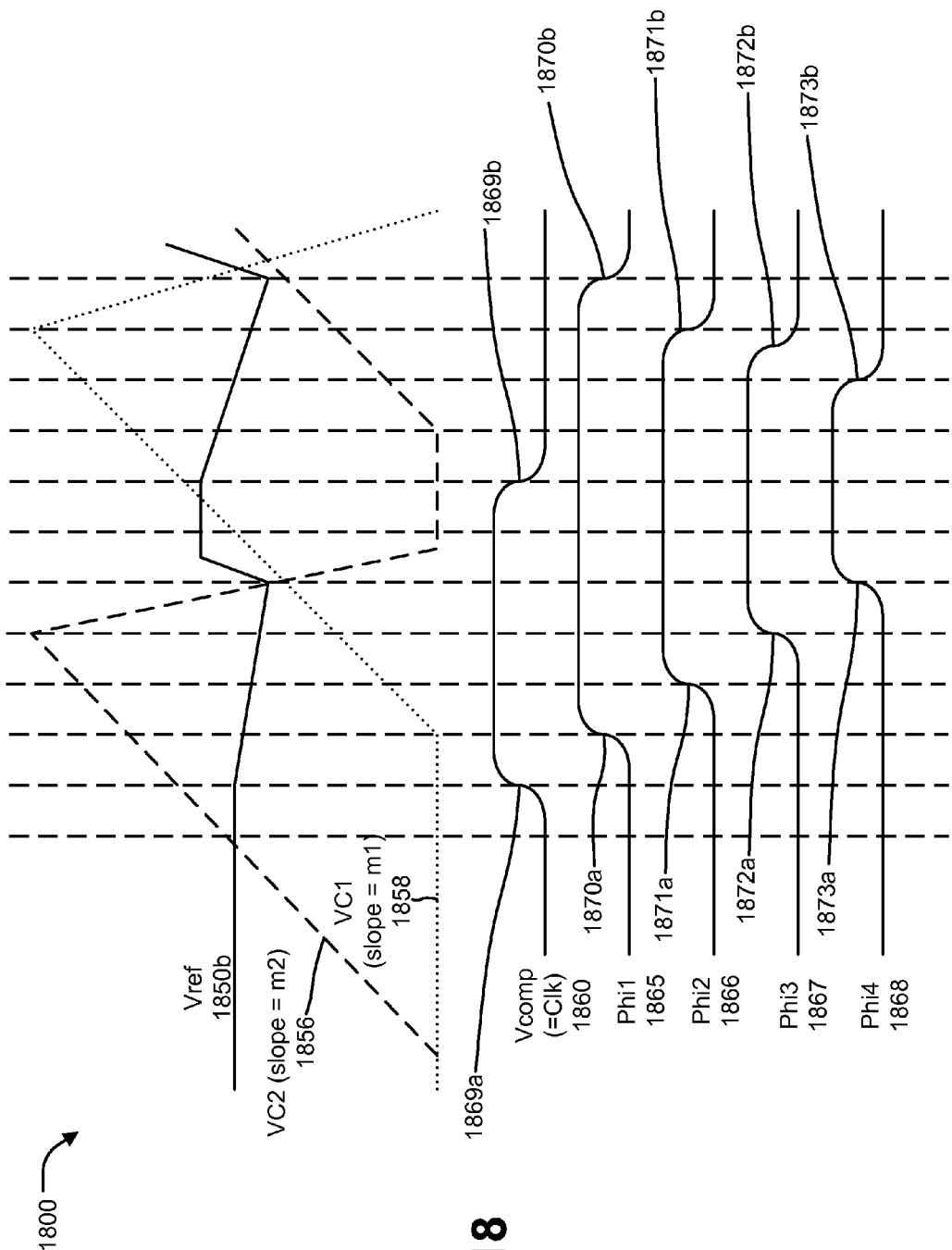
FIG. 18 is a voltage and timing diagram illustrating flicker noise cancellation in a relaxation oscillator.

FIG. 18 is a voltage and timing diagram 1800 illustrating flicker noise cancellation in a relaxation oscillator 410. The rising edge 1870a of phi1 1865 follows the rising edge 1869a of Vcomp 1860 (the clock signal). The rising edge 1871a of phi2 1866 follows the rising edge 1870a of phi1 1865. The rising edge 1872a of phi3 1867 follows the rising edge 1871a of phi2 1866. The rising edge 1873a of phi4 1868 follows the rising edge 1872a of phi3 1867. The falling edge 1869b of Vcomp 1860 follows the rising edge 1873a of phi4 1868. The falling edge 1873b of phi4 1868 follows the falling edge 1869b of Vcomp 1860. The falling edge 1872b of phi3 1867 follows the falling edge 1873b of phi4 1868. The falling edge 1871b of phi2 1866 follows the falling edge 1872b of phi3 1867. The falling edge 1870b of phi1 1865 follows the falling edge 1871b of phi2 1866.

The reference voltage Vref 1850b in the relaxation oscillator 410 does not remain constant. Instead, in order to compensate for flicker noise due to current sources and flicker noise due to the comparator 410, the reference voltage Vref 1850b changes based on the phases phi1 1865, phi2 1866, phi3 1867, and phi4 1868.

The voltage VC1 1858 (slope=m1) across the first capacitor C1 448 and the voltage VC2 1856 (slope=m2) across the second capacitor C2 449 are illustrated. When the second capacitor C2 449 charges faster than expected due to flicker noise, the slope m2 of the VC2 1856 curve is steeper than expected and the first half period of the relaxation oscillator 410 will be shorter than expected. To compensate for this jitter, the reference resistor 441 may be adjusted to a higher value so that the first capacitor C1 448 charges for a longer period of time before discharging. Thus, the slope m1 of the VC1 1858 curve may be shallower and the second half period of the relaxation oscillator 410 may be longer than in noiseless conditions. Alternatively, when the capacitor C2 449 charges slower than expected due to flicker noise, the reference resistor 441 may be adjusted to a lower value so that the first capacitor C1 448 charges for a shorter period of time before discharging. Thus, the slope m1 of the VC1 1858 curve may be steeper and the second half period of the relaxation oscillator 410 may be shorter than in noiseless conditions. A relaxation oscillator 410 may thus reduce jitter.

Figure 19:
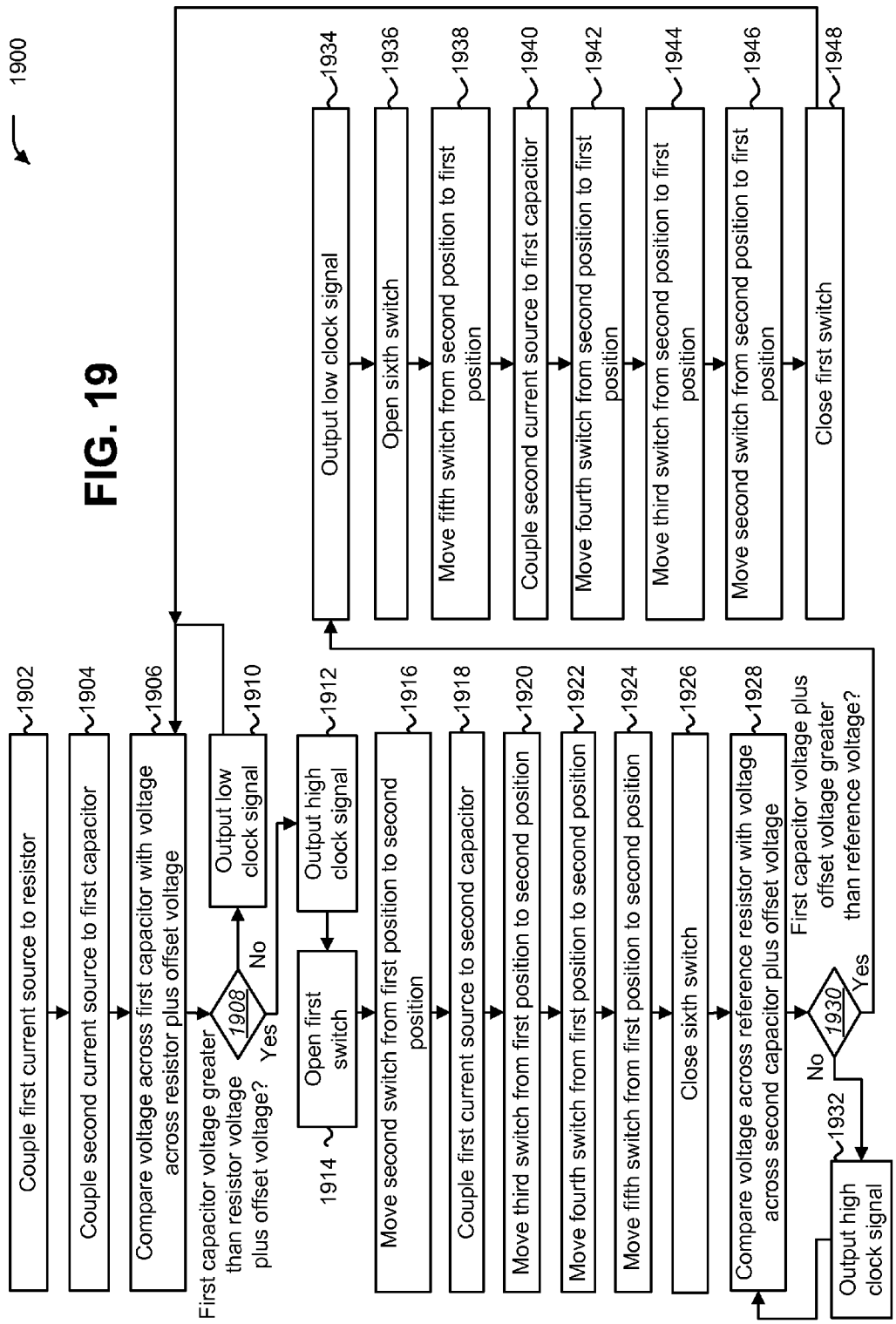
FIG. 19 is a flow diagram of another method for flicker noise cancellation in a relaxation oscillator.

FIG. 19 is a flow diagram of another method 1900 for flicker noise cancellation in a relaxation oscillator 410. The method 1900 may be performed by the relaxation oscillator 410. The relaxation oscillator 410 may couple 1902 a first current source I2 435 to a reference node 450a. The reference node 450a may be coupled to a reference resistor 441. The first current source I2 435 may induce a voltage Vref 450b at the reference node 450a. The relaxation oscillator 410 may also couple 1904 a second current source I1 434 to a first capacitor C2 449. The second current source I1 434 may induce a voltage VC2 456 across the first capacitor C2 449. The relaxation oscillator 410 may then compare 1906 the voltage VC2 456 across the first capacitor C2 449 with the voltage Vref 450b across the resistor 441 plus an offset voltage Voff 451.

The relaxation oscillator 410 may determine 1908 whether the voltage VC2 456 across the first capacitor C2 449 is greater than the voltage Vref 450b across the resistor 441 plus the offset voltage Voff 451. If the voltage VC2 456 across the first capacitor C2 449 is not greater than the voltage Vref 450b across the resistor 441 plus the offset voltage Voff 451, the relaxation oscillator 410 may output 1910 a low clock signal. The relaxation oscillator 410 may then return to comparing 1906 the voltage VC2 456 across the first capacitor C2 449 with the voltage Vref 450b across the resistor 441 plus the offset voltage Voff 451.

If the voltage VC2 456 across the first capacitor C2 449 is greater than the voltage Vref 450b across the resistor 441 plus the offset voltage Voff 451, the relaxation oscillator 410 may output 1912 a high clock signal. The relaxation oscillator 410 may then open 1914 a first switch 436. The relaxation oscillator 410 may next move 1916 a second switch 437 from a first position 438a to a second position 438b. The relaxation oscillator 410 may then couple 1918 the first current source I2 435 to a second capacitor C1 448. The relaxation oscillator 410 may next move 1920 a third switch 439 from a first position 440a to a second position 440b. The relaxation oscillator 410 may then move 1922 a fourth switch 443 from a first position 444a to a second position 444b. The relaxation oscillator 410 may also move 1924 a fifth switch 445 from a first position 446a to a second position 446b. Once the relaxation oscillator 410 has moved the fifth switch 445 from the first position 446a to the second position 446b, the relaxation oscillator 410 may close 1926 a sixth switch 447. The relaxation oscillator 410 may delay between moving each switch.

The relaxation oscillator 410 may then compare 1928 the voltage Vref 450b across the reference resistor 441 with the voltage VC1 458 across the second capacitor C1 448 plus the offset voltage Voff 451. The relaxation oscillator 410 may determine 1930 whether the voltage VC1 458 across the second capacitor C1 448 plus the offset voltage Voff 451 is greater than the voltage Vref 450b across the reference resistor 441. If the voltage VC1 458 across the second capacitor C1 448 plus the offset voltage Voff 451 is not greater than the voltage Vref 450b across the reference resistor 441, the relaxation oscillator 410 may output 1932 a high clock signal. The relaxation oscillator 410 may then continue to compare 1928 the voltage Vref 450b across the reference resistor 441 with the voltage VC1 458 across the second capacitor C1 448 plus the offset voltage Voff 451. If the voltage VC1 458 across the second capacitor C1 448 plus the offset voltage Voff 451 is greater than the voltage Vref 450b across the reference resistor 441, the relaxation oscillator 410 may output 1934 a low clock signal.

Once the relaxation oscillator 410 has output 1934 a low clock signal, the relaxation oscillator 410 may open 1936 the sixth switch 447. Next, the relaxation oscillator 410 may move 1938 the fifth switch 445 from the second position 446b to the first position 446a. The relaxation oscillator 410 may then couple 1940 the second current source I1 434 to the first capacitor C2 449. The relaxation oscillator 410 may next move 1942 the fourth switch 443 from the second position 444b to the first position 444a. The relaxation oscillator 410 may then move 1944 the third switch 439 from the second position 440b to the first position 440a. The relaxation oscillator 410 may also move 1946 the second switch 437 from the second position 438b to the first position 438a. Once the relaxation oscillator 410 has moved 1946 the second switch 437 from the second position 438b to the first position 438a, the relaxation oscillator 410 may close 1948 the first switch 436. The relaxation oscillator 410 may then compare 1906 the voltage VC2 456 across the first capacitor C2 449 with the voltage Vref 450b across the reference resistor 441 plus the offset voltage Voff 451.

Figure 20:
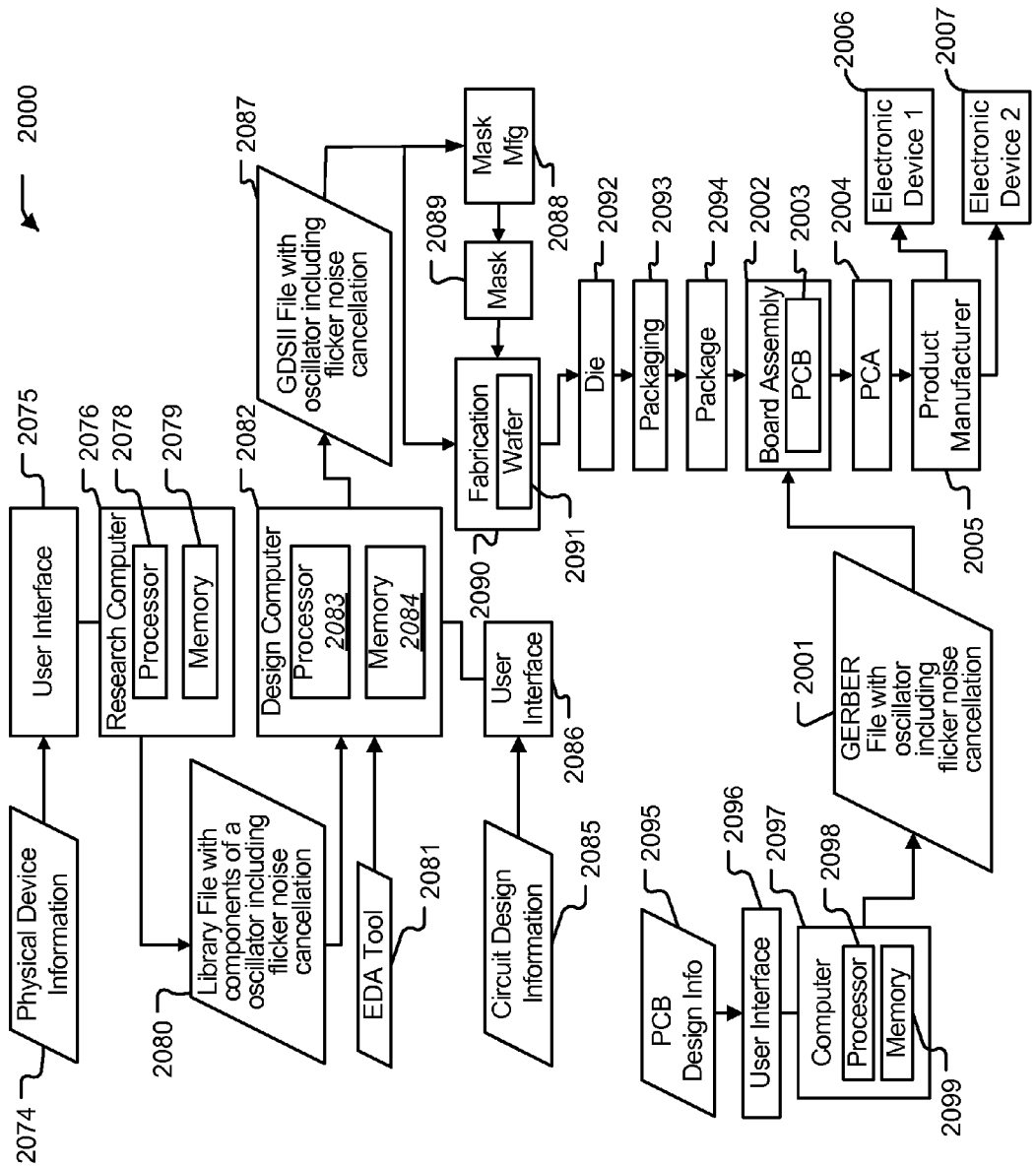
FIG. 20 is a flow diagram of a method for an electronic device manufacturing process of a relaxation oscillator for use in the present systems and methods.

FIG. 20 is a flow diagram of a method 2000 for an electronic device manufacturing process of a relaxation oscillator 410 for use in the present systems and methods. The foregoing devices, functionalities, and circuits may be designed and configured into computer files (e.g. RTL, GDSII, GERBER) stored on computer readable media. Some or all such files may be provided to fabrication handlers who fabricate devices based on such files. Resulting products include semiconductor wafers that are then cut into semiconductor die and packaged into a semiconductor chip for use in electronic devices 101 such as that described above in relation to FIG. 1.

Physical device information 2074 may be received in the manufacturing process. The physical device information 2074 may be received via a research computer 2076. The physical device information 2074 may include design information representing at least one physical property of a relaxation oscillator 110 with flicker noise cancellation. For example, the physical device information 2074 may include physical parameters, material characteristics and structure information that is entered into the research computer 2076 via a user interface 2075. The research computer 2076 may include a processor 2078, such as one or more processing cores, coupled to a computer readable medium such as a memory 2079. The memory 2079 may store computer readable instructions that are executable to cause the processor 2078 to transform the physical device information 2074 to comply with a file format and to generate a library file 2080.

The library file 2080 may include at least one data file that includes the transformed design information. For example, the library file 2080 may include a relaxation oscillator 110 with flicker noise cancellation that is provided for use with an electronic design automation (EDA) tool 2081.

The library file 2080 may be used in conjunction with the EDA tool 2081 at a design computer 2082 that includes a processor 2083, such as one or more processing cores, coupled to memory 2084. The EDA tool 2081 may be stored as processer executable instructions at the memory 2084 to enable a user of the design computer 8082 to design a circuit that includes a relaxation oscillator 110 with flicker noise cancellation using the library file 2080. For example, the user of the design computer 2082 may enter circuit design information 2085 via a user interface 2086 coupled to the design computer 2082. The circuit design information 2085 may include design information representing at least one physical property of a semiconductor device, such as a relaxation oscillator 110 with flicker noise cancellation. The circuit design property may include identification of particular circuits and relationships to other elements in a circuit design, positioning information, feature size information, interconnection information, or other information representing a physical property of a semiconductor device.

The design computer 2082 may be configured to transform the design information, including the circuit design information 2085 to comply with a file format. For example, the file information may include a database binary file format representing planar geographic shapes, text labels, and other information about a circuit layout in a hierarchical format, such as a Graphic Data System (GDSII) file format. The design computer 2082 may be configured to generate a data file 2087 that includes the transformed design information, such as a GDSII file that includes information describing a relaxation oscillator 110 with flicker noise cancellation, in addition to other circuits or information.

The GDSII file 2087 may be received at a fabrication process to manufacture a relaxation oscillator 110 with flicker noise cancellation, according to transformed information in the GDSII file 2087. For example, a device manufacture process may include providing the GDSII file 2087 to a mask manufacturer 2088 to create one or more masks 2089, such as masks 2089 to be used for lithography processing. The mask 2089 may be used during the fabrication process 2090 to generate one or more wafers 2091 that may be tested and separated into dies 2092. The die 2092 may include a relaxation oscillator 110 with flicker noise cancellation.

The die 2092 may be provided to a packaging process 2093 where the die 2092 is incorporated into a package 2094. For example, the package 2094 may include the single die 2092 or multiple dies 2092, such as a system-in-a-package (SiP) arrangement. The package 2094 may be configured to conform to one or more standards or specifications, such as Joint Electron Device Engineering Council (JEDEC) standards.

Information regarding the package 2094 may be distributed to various product designers, such as via a component library stored at a computer 2097. The computer 2097 may include a processor 2098, such as one or more processing cores, coupled to memory 2099. A printed circuit board (PCB) tool 2003 may be stored as processor executable instructions at the memory to process PCB design information 2095 received from a user of the computer 2097 via a user interface 2096. The PCB design information 2095 may include physical positioning information of a packaged semiconductor device on a circuit board, the packaged semiconductor device corresponding to the package including the relaxation oscillator with flicker noise cancellation.

The computer 2097 may be configured to transform the PCB design information 2095 to generate a data file 2001, such as a GERBER file with data that includes physical positioning information of a packaged semiconductor device on a circuit board, as well as layout of electrical connections such as traces and vias, where the packaged semiconductor device corresponds to the package including the device components to be used in the relaxation oscillator 110 with flicker noise cancellation. In one configuration, the data file 2001 generated by the transformed PCB design information may have a format other than a GERBER format.

The GERBER file 2001 may be received at a board assembly process 2002 and used to create PCBs 2003, manufactured in accordance with the design information stored within the GERBER file 2001. For example, the GERBER file 2001 may be uploaded to one or more machines for performing various steps of a PCB production process. The PCB 2003 may be populated with electronic components including the package to form a represented printed circuit assembly (PCA) 2004.

The PCA 2004 may be received at a product manufacture process 2005 and integrated into one or more electronic devices, such as a first electronic device 2006 and a second electronic device 2007. The first electronic device 2006, the second electronic device 2007, or both, may be a set top box, a music player, a video player, an entertainment unit, a navigation device, a communications device, a personal digital assistant (PDA), a fixed location data unit, or a computer. One or more of the electronic devices may be remote units such as mobile phones, hand-held personal communication systems (PCS) units, portable data units such as personal data assistants, global positioning system (GPS) enabled devices, navigation devices, fixed location data units such as meter reading equipment, Bluetooth headsets, any other device that stores or retrieves data or computer instructions, or any combination thereof.

Figure 21:
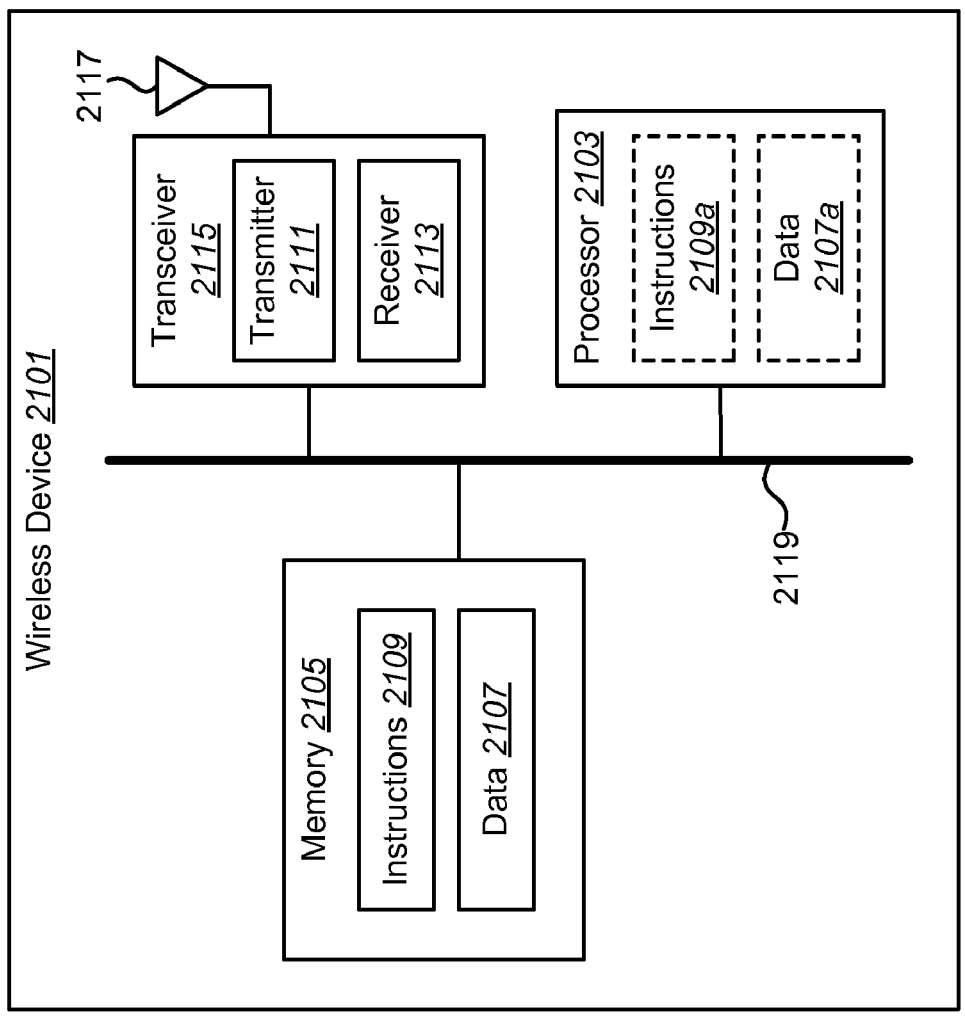
FIG. 21 illustrates certain components that may be included within an electronic device.

FIG. 21 illustrates certain components that may be included within an electronic device 2101. The electronic device 2101 may be a wireless communication device. The electronic device 2101 includes a processor 2103. The processor 2103 may be a general purpose single- or multi-chip microprocessor (e.g., an ARM), a special purpose microprocessor (e.g., a digital signal processor (DSP)), a microcontroller, a programmable gate array, etc. The processor 2103 may be referred to as a central processing unit (CPU). Although just a single processor 2103 is shown in the electronic device 2101 of FIG. 21, in an alternative configuration, a combination of processors (e.g., an ARM and DSP) could be used.

The electronic device 2101 also includes memory 2105. The memory 2105 may be any electronic component capable of storing electronic information. The memory 2105 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 2107 and instructions 2109 may be stored in the memory 2105. The instructions 2109 may be executable by the processor 2103 to implement the methods disclosed herein. Executing the instructions 2109 may involve the use of the data 2107 that is stored in the memory 2105. When the processor 2103 executes the instructions 2109, various portions of the instructions 2109a may be loaded onto the processor 2103, and various pieces of data 2107a may be loaded onto the processor 2103.

The electronic device 2101 may also include a transmitter 2111 and a receiver 2113 to allow transmission and reception of signals to and from the electronic device 2101. The transmitter 2111 and receiver 2113 may be collectively referred to as a transceiver 2115. An antenna 2117 may be electrically coupled to the transceiver 2115. The electronic device 2101 may also include (not shown) multiple transmitters, multiple receivers, multiple transceivers and/or multiple antenna.

The various components of the electronic device 2101 may be coupled together by one or more buses, which may include a power bus, a control signal bus, a status signal bus, a data bus, etc. For the sake of clarity, the various buses are illustrated in FIG. 21 as a bus system 2119.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The terms "computer-readable medium" or "computer-program product" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 2, 15, 16 and 19, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

The invention claimed is:

1. A method for flicker noise cancellation in an oscillator, the method comprising:
    coupling a first current source to a first capacitor of the oscillator during a first time period of an oscillation period of the oscillator;
    coupling the first current source to a reference node of the oscillator during a second time period of the oscillation period; and
    coupling a second current source to a second capacitor of the oscillator during a third time period of the oscillation period.

2. The method of claim 1, wherein current produced by the first current source is affected by flicker noise in the oscillator.

3. The method of claim 1, wherein the oscillator does not include a crystal.

4. The method of claim 1, wherein the oscillator is a relaxation oscillator.

5. The method of claim 1, wherein the first current source is selectively coupled to the first capacitor and to the reference node via a switch.

6. The method of claim 1, wherein the reference node is coupled to a resistor.

7. The method of claim 1, wherein a sum of the first time period and the second time period is substantially equal to the oscillation period.

8. The method of claim 1, further comprising:
    coupling the second current source to the reference node during a fourth time period of the oscillation period.

9. The method of claim 8, wherein a sum of the third time period and the fourth time period is substantially equal to the oscillation period.

10. The method of claim 8, further comprising:
    selectively coupling the first capacitor to a first input of a comparator of the oscillator;
    selectively coupling the second capacitor to a second input of the comparator; and
    selectively coupling the reference node to the first input or the second input, wherein at least one of the first capacitor and the second capacitor is coupled to the comparator.

11. An oscillator comprising:
    a first capacitor;
    a second capacitor;
    a reference node;
    a first controller configured to couple a first current source to the first capacitor during a first time period and to couple the first current source to the reference node during a second time period; and
    a second controller configured to couple a second current source to the second capacitor during a third time period.

12. The oscillator of claim 11, wherein the oscillator does not include a crystal.

13. The oscillator of claim 11, wherein the first controller comprises a switch.

14. The oscillator of claim 11, wherein the reference node is coupled to a resistor.

15. The oscillator of claim 11, wherein a sum of the first time period and the second time period is substantially equal to an oscillation period of the oscillator.

16. The oscillator of claim 11, wherein current produced by the first current source is affected by flicker noise in the oscillator.

17. The oscillator of claim 11, wherein the second controller is further configured to couple the second current source to the reference node during a fourth time period.

18. The oscillator of claim 17, wherein a sum of the third time period and the fourth time period is substantially equal to an oscillation period of the oscillator.

19. The oscillator of claim 17, further comprising a comparator that includes a first input and a second input and logic configured to:
    selectively couple the first capacitor to the first input and the reference node to the second input;
    selectively couple the reference node to the first input and the second capacitor to the second input; and
    selectively couple the first capacitor to the first input and the second capacitor to the second input.

20. An oscillator comprising:
    a first capacitor;
    a second capacitor;
    a first current source;
    a second current source;
    a reference node; and
    a controller, wherein the controller is configured to couple the first current source to the first capacitor and the second current source to the reference node during a first time period, wherein the controller is configured to couple the first current source to the reference node and the second current source to the second capacitor during a second time period, and wherein a sum of the first time period and the second time period is substantially equal to an oscillation period of the oscillator.

21. The oscillator of claim 20, wherein the controller is configured to couple the first current source to the first capacitor and the second current source to the second capacitor during a third time period.

22. The oscillator of claim 20, further comprising a reference resistor, wherein the reference node is coupled to the reference resistor.

23. The oscillator of claim 20, wherein the controller comprises a first switch, a second switch, a third switch, a fourth switch, a fifth switch, and a sixth switch, and wherein the controller cycles the oscillator through multiple states using five configurations of the switches to reduce flicker noise in the oscillator.

24. The oscillator of claim 23, wherein the first switch and the second switch are responsive to a first phase generated by a phase generator, the third switch is responsive to a second phase generated by the phase generator, the fourth switch is responsive to a third phase generated by the phase generator, and the fifth switch and the sixth switch are responsive to a fourth phase generated by the phase generator.

25. The oscillator of claim 24, further comprising a comparator, wherein the comparator has a first input and a second input, and wherein the phase generator is controlled by an output of the comparator.

26. The oscillator of claim 25, wherein a rising edge of the output of the comparator triggers a rising edge of the first phase followed by a rising edge of the second phase followed by a rising edge of the third phase followed by a rising edge of the fourth phase.

27. The oscillator of claim 25, wherein a falling edge of the output of the comparator triggers a falling edge of the fourth phase followed by a falling edge of the third phase followed by a falling edge of the second phase followed by a falling edge of the first phase.

28. The oscillator of claim 23, further comprising a comparator, wherein the comparator has a first input and a second input, wherein the first switch selectively couples the first current source and the first input of the comparator, wherein the second switch selectively couples the first capacitor to ground in a first position and to the first current source in a second position, wherein the third switch selectively couples the first input of the comparator to the reference node in a first position and to the first capacitor in a second position, wherein the fourth switch selectively couples the second input of the comparator to the second current source in a first position and to the reference node in a second position, wherein the fifth switch selectively couples the second capacitor to the second current source in a first position and to ground in a second position, and wherein the sixth switch selectively couples the reference node to the second current source.

29. The oscillator of claim 28, wherein a first configuration of the switches comprises the first switch closed, the second switch in the first position, the third switch in the first position, the fourth switch in the first position, the fifth switch in the first position, and the sixth switch open.

30. The oscillator of claim 28, wherein a second configuration of the switches comprises the first switch open, the second switch in the second position, the third switch in the first position, the fourth switch in the first position, the fifth switch in the first position, and the sixth switch open.

31. The oscillator of claim 28, wherein a third configuration of the switches comprises the first switch open, the second switch in the second position, the third switch in the second position, the fourth switch in the first position, the fifth switch in the first position, and the sixth switch open.

32. The oscillator of claim 28, wherein a fourth configuration of the switches comprises the first switch open, the second switch in the second position, the third switch in the second position, the fourth switch in the second position, the fifth switch in the first position, and the sixth switch open.

33. The oscillator of claim 28, wherein a fifth configuration of the switches comprises the first switch open, the second switch in the second position, the third switch in the second position, the fourth switch in the second position, the fifth switch in the second position, and the sixth switch closed.

34. The oscillator of claim 20, wherein the oscillator is a relaxation oscillator.

35. The oscillator of claim 20, wherein the oscillator is used in a wireless communication device.

36. A method for flicker noise cancellation in an oscillator, the method comprising:
selectively configuring a first input and a second input to a comparator with one of a first configuration, a second configuration, a third configuration, a fourth configuration or a fifth configuration; and
cycling components of the oscillator through multiple states using a controller, wherein the components of the oscillator comprise a first current source, a second current source, a first capacitor, a second capacitor and a reference node, and wherein cycling the components of the oscillator through multiple states causes the oscillator to oscillate with reduced flicker noise.

37. The method of claim 36, wherein the controller is configured to couple the first current source to the first capacitor during a first time period and to couple the first current source to the reference node during a second time period, and wherein a sum of the first time period and the second time period is substantially equal to an oscillation period of the oscillator.

38. The method of claim 36, wherein the controller is configured to couple the second current source to the second capacitor during a third time period and to couple the second current source to the reference node during a fourth time period, and wherein a sum of the third time period and the fourth time period is substantially equal to an oscillation period of the oscillator.

39. The method of claim 36, wherein the oscillator further comprises a reference resistor, and wherein the reference node is coupled to the reference resistor.

40. The method of claim 36, wherein the controller comprises a first switch, a second switch, a third switch, a fourth switch, a fifth switch, and a sixth switch, and wherein the controller cycles the oscillator through multiple states using five configurations of the switches to reduce flicker noise in the oscillator.

41. The method of claim 40, wherein the first switch and the second switch are responsive to a first phase generated by a phase generator, the third switch is responsive to a second phase generated by the phase generator, the fourth switch is responsive to a third phase generated by the phase generator, and the fifth switch and the sixth switch are responsive to a fourth phase generated by the phase generator.

42. The method of claim 41, wherein the phase generator is controlled by an output of the comparator.

43. The method of claim 42, wherein a rising edge of the output of the comparator triggers a rising edge of the first phase followed by a rising edge of the second phase followed by a rising edge of the third phase followed by a rising edge of the fourth phase.

44. The method of claim 42, wherein a falling edge of the output of the comparator triggers a falling edge of the fourth phase followed by a falling edge of the third phase followed by a falling edge of the second phase followed by a falling edge of the first phase.

45. The method of claim 40, wherein the first switch selectively couples the first current source and the first input of the comparator, wherein the second switch selectively couples the first capacitor to ground in a first position and to the first current source in a second position, wherein the third switch selectively couples the first input of the comparator to the reference node in a first position and to the first capacitor in a second position, wherein the fourth switch selectively couples the second input of the comparator to the second current source in a first position and to the reference node in a second position, wherein the fifth switch selectively couples the second capacitor to the second current source in a first position and to ground in a second position, and wherein the sixth switch selectively couples the reference node to the second current source.

46. The method of claim 45, wherein a first configuration of the switches comprises the first switch closed, the second switch in the first position, the third switch in the first position, the fourth switch in the first position, the fifth switch in the first position, and the sixth switch open.

47. The method of claim 45, wherein a second configuration of the switches comprises the first switch open, the second switch in the second position, the third switch in the first position, the fourth switch in the first position, the fifth switch in the first position, and the sixth switch open.

48. The method of claim 45, wherein a third configuration of the switches comprises the first switch open, the second switch in the second position, the third switch in the second position, the fourth switch in the first position, the fifth switch in the first position, and the sixth switch open.

49. The method of claim 45, wherein a fourth configuration of the switches comprises the first switch open, the second switch in the second position, the third switch in the second position, the fourth switch in the second position, the fifth switch in the first position, and the sixth switch open.

50. The method of claim 45, wherein a fifth configuration of the switches comprises the first switch open, the second switch in the second position, the third switch in the second position, the fourth switch in the second position, the fifth switch in the second position, and the sixth switch closed.

51. The method of claim 36, wherein the oscillator is a relaxation oscillator.

52. The method of claim 36, wherein the oscillator is used in a wireless communication device.

53. The method of claim 40, wherein cycling the components of the oscillator through multiple states comprises:
coupling the first current source to the reference node;
coupling the second current source to the first capacitor;
comparing a voltage across the first capacitor with a voltage at the reference node plus the offset voltage;
outputting a low clock signal if the voltage across the first capacitor is not greater than the voltage at the reference node plus the offset voltage;
outputting a high clock signal if the voltage across the first capacitor is greater than the voltage at the reference node plus the offset voltage;
opening the first switch;
moving the second switch from a first position to a second position;
coupling the first current source to the second capacitor;
moving the third switch from a first position to a second position;
moving the fourth switch from a first position to a second position;
moving the fifth switch from a first position to a second position;
closing the sixth switch;
comparing a voltage at the reference node with a voltage across the first capacitor plus the offset voltage;
outputting a high clock signal if the voltage at the reference node is not greater than the voltage across the first capacitor plus the offset voltage;
outputting a low clock signal if the voltage at the reference node is greater than the voltage across the first capacitor plus the offset voltage;
opening the sixth switch;
moving the fifth switch from the second position to the first position;
moving the fourth switch from the second position to the first position;
moving the third switch from the second position to the first position;
moving the second switch from the second position to the first position; and
closing the first switch.

54. An apparatus for flicker noise cancellation in an oscillator, comprising:
means for selectively configuring a first input and a second input to a comparator with one of a first configuration, a second configuration, a third configuration, a fourth configuration and a fifth configuration; and
means for cycling components of the oscillator through multiple states using a controller, wherein the components of the oscillator comprise a first current source, a second current source, a first capacitor, a second capacitor and a reference node, and wherein cycling the components of the oscillator through multiple states causes the oscillator to oscillate with reduced flicker noise.

* * * * *